US008549449B2

(12) United States Patent
Suaya et al.

(10) Patent No.: US 8,549,449 B2
(45) Date of Patent: Oct. 1, 2013

(54) MUTUAL INDUCTANCE EXTRACTION USING DIPOLE APPROXIMATIONS

(75) Inventors: Roberto Suaya, Meylan (FR); Rafael Escovar, Grenoble (FR); Salvador Ortiz, Grenoble (FR)

(73) Assignee: Mentor Graphics Corporation, Wilsonville, OR (US)

( * ) Notice: Subject to any disclaimer, the term of this patent is extended or adjusted under 35 U.S.C. 154(b) by 799 days.

(21) Appl. No.: 12/380,138

(22) Filed: Feb. 23, 2009

(65) Prior Publication Data

US 2009/0172613 A1     Jul. 2, 2009

Related U.S. Application Data

(63) Continuation of application No. 10/972,025, filed on Oct. 21, 2004, now Pat. No. 7,496,871.

(60) Provisional application No. 60/513,343, filed on Oct. 21, 2003.

(51) Int. Cl.
    *G06F 17/50*          (2006.01)

(52) U.S. Cl.
USPC ........... 716/106; 716/101; 716/110; 716/111; 716/115; 716/132; 716/136; 716/139

(58) Field of Classification Search
USPC ................. 716/101, 106, 110, 111, 115, 132, 716/136, 139
See application file for complete search history.

(56) References Cited

U.S. PATENT DOCUMENTS

| | | | |
|---|---|---|---|
| 4,026,040 A | 5/1977 | Valentine et al. | |
| 5,436,564 A | 7/1995 | Kreger et al. | |
| 5,578,925 A * | 11/1996 | Molyneaux et al. | 324/318 |
| 5,602,479 A * | 2/1997 | Srinivasan et al. | 324/318 |
| 5,767,009 A | 6/1998 | Yoshida et al. | |
| 5,781,009 A | 7/1998 | Lee et al. | |
| 5,826,215 A | 10/1998 | Garrett et al. | |
| 5,973,495 A | 10/1999 | Mansfield | |
| 5,998,999 A | 12/1999 | Richard et al. | |
| 6,053,950 A | 4/2000 | Shinagawa | |
| 6,292,766 B1 | 9/2001 | Mattos et al. | |

(Continued)

OTHER PUBLICATIONS

Anderson; "An electromagnetic tracking system using printed-circuit coils"; Publication Year: 2001; Antennas and Propagation Society International Symposium, 2001. IEEE; vol. 1; pp. 304-307 vol. 1.*

(Continued)

*Primary Examiner* — Helen Rossoshek
(74) *Attorney, Agent, or Firm* — Klarquist Sparkman, LLP

(57) ABSTRACT

Various methods for analyzing mutual inductance in an integrated circuit layout are disclosed. In one exemplary embodiment, for instance, a circuit description indicative of the layout of signal wires and ground wires in the circuit is received. The signal wires and the ground wires are grouped into at least a first bundle and a second bundle, wherein the first bundle and the second bundle each comprise a respective signal-wire segment and one or more corresponding ground-wire segments. A representative dipole moment is calculated for the first bundle. Using the representative dipole moment, the mutual inductance between the first bundle and the second bundle is calculated. Computer-readable media storing computer-executable instructions for causing a computer to perform any of the disclosed methods or storing design databases created or modified using any of the disclosed techniques are also disclosed.

27 Claims, 19 Drawing Sheets

(56) References Cited

U.S. PATENT DOCUMENTS

| | | | |
|---|---|---|---|
| 6,295,634 B1 | 9/2001 | Matsumoto | |
| 6,304,230 B1* | 10/2001 | Panther et al. | 343/867 |
| 6,311,313 B1 | 10/2001 | Camporese et al. | |
| 6,327,696 B1 | 12/2001 | Mahajan | |
| 6,353,801 B1 | 3/2002 | Sercu et al. | |
| 6,378,080 B1 | 4/2002 | Anjo et al. | |
| 6,381,730 B1 | 4/2002 | Chang et al. | |
| 6,434,724 B1 | 8/2002 | Chang et al. | |
| 6,453,444 B1 | 9/2002 | Shepard | |
| 6,459,352 B1 | 10/2002 | Liu et al. | |
| 6,487,703 B1 | 11/2002 | McBride et al. | |
| 6,578,174 B2 | 6/2003 | Zizzo | |
| 6,584,596 B2 | 6/2003 | Buffet et al. | |
| 6,588,002 B1 | 7/2003 | Lampaert et al. | |
| 6,604,225 B1 | 8/2003 | Otsu et al. | |
| 6,643,831 B2 | 11/2003 | Chang et al. | |
| 6,651,230 B2 | 11/2003 | Cohn et al. | |
| 6,675,365 B2 | 1/2004 | Elzinga | |
| 6,742,165 B2 | 5/2004 | Lev et al. | |
| 6,820,245 B2 | 11/2004 | Beattie et al. | |
| 6,853,194 B2* | 2/2005 | Nelson et al. | 324/329 |
| 6,934,669 B1 | 8/2005 | Suaya et al. | |
| 6,938,231 B2 | 8/2005 | Yoshida et al. | |
| 6,966,040 B2 | 11/2005 | Ismailov | |
| 6,980,921 B2* | 12/2005 | Anderson et al. | 702/150 |
| 6,981,230 B1 | 12/2005 | Lin et al. | |
| 7,013,442 B2 | 3/2006 | Suaya et al. | |
| 7,078,987 B1 | 7/2006 | Petrovic | |
| 7,096,148 B2* | 8/2006 | Anderson et al. | 702/134 |
| 7,096,174 B2 | 8/2006 | Beattie et al. | |
| 7,099,808 B2 | 8/2006 | Suaya et al. | |
| 7,260,796 B2 | 8/2007 | Suaya et al. | |
| 7,340,703 B2* | 3/2008 | Hegazy et al. | 716/115 |
| 7,350,175 B2 | 3/2008 | Iwaki et al. | |
| 7,426,706 B2 | 9/2008 | Suaya et al. | |
| 7,454,300 B2* | 11/2008 | Suaya et al. | 702/65 |
| 7,496,871 B2 | 2/2009 | Suaya et al. | |
| 7,689,949 B1 | 3/2010 | Ling et al. | |
| 7,689,962 B2* | 3/2010 | Suaya et al. | 716/122 |
| 7,823,096 B2 | 10/2010 | Katagiri et al. | |
| 7,949,979 B1 | 5/2011 | Alexander | |
| 8,161,438 B2 | 4/2012 | Suaya et al. | |
| 8,214,781 B1 | 7/2012 | Liu et al. | |
| 8,214,785 B2 | 7/2012 | Kouzaki et al. | |
| 2002/0104063 A1 | 8/2002 | Chang et al. | |
| 2002/0116696 A1 | 8/2002 | Suaya et al. | |
| 2003/0131334 A1 | 7/2003 | Suaya et al. | |
| 2003/0184285 A1* | 10/2003 | Anderson et al. | 324/207.17 |
| 2004/0158801 A1 | 8/2004 | Leisten et al. | |
| 2005/0076317 A1 | 4/2005 | Ling et al. | |
| 2005/0120316 A1 | 6/2005 | Suaya et al. | |
| 2005/0268260 A1 | 12/2005 | Suaya et al. | |
| 2006/0143586 A1 | 6/2006 | Suaya et al. | |
| 2006/0282492 A1 | 12/2006 | Suaya et al. | |
| 2007/0018767 A1 | 1/2007 | Gabara | |
| 2007/0225925 A1 | 9/2007 | Suaya et al. | |
| 2007/0226659 A1 | 9/2007 | Suaya et al. | |
| 2008/0221795 A1 | 9/2008 | Amundsen et al. | |
| 2008/0276207 A1 | 11/2008 | Suaya et al. | |
| 2009/0013300 A1 | 1/2009 | Suaya et al. | |
| 2009/0228847 A1* | 9/2009 | Suaya | 716/4 |

OTHER PUBLICATIONS

Afzali-Kusha et al., "Substrate Noise Coupling in SoC Design: Modeling, Avoidance, and Validation," *Proc. of the IEEE*, vol. 94, No. 12, pp. 2109-2138 (Dec. 2006).

Aksun, "A Robust Approach for the Derivation of Closed-Form Green's Functions," *IEEE Trans. on MicrowaveTheory and Tech.*, vol. 44, No. 5, pp. 651-658 (May 1996).

Aksun et al., "Clarification of Issues on the Closed-Form Green's Functions in Stratified Media," *IEEE Trans. on Antennas and Propagation*, vol. 53, No. 11, pp. 3644-3653 (Nov. 2005).

Bannister, "Summary of Image Theory Expressions for the Quasi-Static Fields of Antennas at or above the Earth's Surface," *IEEE Proc.*, vol. 67, No. 7, pp. 1001-1008 (Jul. 1979).

Charbon et al., *Substrate Noise: Analysis and Optimization for IC Design*, pp. 11-17 (Apr. 2001).

Chew, *Waves and Fields in Inhomogeneous Media*, pp. 70-76 (1995).

Chow et al., "Complex Images for Electrostatic Field Computation in Multilayered Media," *IEEE Trans. on Microwave Theory and Techniques*, vol. 39, No. 3, pp. 1120-1125 (Jul. 1991).

Coperich et al., "Systematic Development of Transmission-Line Models for Interconnects with Frequency-Dependent Losses," *IEEE Trans. on Microwave Theory and Techniques*, vol. 49, No. 10, pp. 1677-1685 (Oct. 2001).

Deutsch et al., "When are Transmission-Line Effects Important for On-Chip Interconnections?," *IEEE Trans. on Microwave Theory and Techniques*, vol. 45, No. 10, pp. 1836-1846 (Oct. 1997).

Dural et al, "Closed-Form Green's Functions for General Sources and Stratified Media," *IEEE Trans. on Microwave Theory and Techniques*, vol. 43, No. 7, pp. 1545-1552 (Jul. 1995).

Escovar et al., "An Improved Long Distance Treatment for Mutual Inductance," *IEEE Trans. on Computer-Aided Design of Integrated Circuits and Systems*, vol. 24, No. 5, pp. 783-793 (May 2005).

Fang et al., "Discrete Image Theory for Horizontal Electric Dipoles in a Multilayered Medium," *IEEE Proc. H: Microwaves, Antennas and Propagation*, vol. 135, No. 5, pp. 297-303 (Oct. 1988).

Golub et al., "Separable Nonlinear Least Squares: The Variable Projection Method and its Applications," *Inverse Problems*, vol. 19, pp. R1-R26 (2003).

Hu, "Full-Wave Analysis of Large Conductor Systems Over Substrate," Ph.D. Dissertation, University of California, Berkeley, 145 pp. (2006).

Jiang et al., "Epeec: Comprehensive Spice-Compatible Reluctance Extraction for High-Speed Interconnects Above Lossy Multilayer Substrates," *IEEE Trans. on Computer-Aided Design of Integrated Circuits and Systems*, vol. 24, No. 10, pp. 1562-1571 (Oct. 2005).

Ling et al., "Discrete Complex Image Method for Green's Functions of General Multilayer Media," *IEEE Microwave and Guided Wave Letters*, vol. 10, No. 10, pp. 400-402 (Oct. 2000).

Moselhy et al., "pFFT in FastMaxwell: A Fast Impedance Extraction Solver for 3D Conductor Structures over Substrate," *Design, Automation and Test in Europe*, pp. 1-6 (2007).

Nabors et al., "Multipole-Accelerated Capacitance Extraction Algorithms for 3-d Structures with Multiple Dielectrics," *IEEE Trans. on Circuits and Systems*, vol. 39, No. 11, pp. 946-954 (1992).

Niknejad et al., "Analysis of Eddy-Current Losses over Conductive Substrates with Applications to Monolithic Inductors and Transformers," *IEEE Trans. on Microwave Theory and Techniques*, vol. 49, No. 1, pp. 166-176 (Jan. 2001).

Notice of Allowance dated Jul. 26, 2007, from U.S. Appl. No. 10/972,025 (published as U.S. Patent Application Publication No. 2005-0120316).

Notice of Allowance dated Aug. 28, 2008, from U.S. Appl. No. 10/972,025 (published as U.S. Patent Application Publication No. 2005-0120316).

Office action dated Jan. 23, 2009, from U.S. Appl. No. 11/435,426 (published as U.S. Patent Application Publication No. 2006-0282492).

Office action dated Sep. 2, 2009, from U.S. Appl. No. 11/435,426 (published as U.S. Patent Application Publication No. 2006-0282492).

Office action dated Dec. 14, 2009, from U.S. Appl. No. 11/435,426 (published as U.S. Patent Application Publication No. 2006-0282492).

Office action dated Feb. 2, 2007, from U.S. Appl. No. 10/972,025 (published as U.S. Patent Application Publication No. 2005-0120316).

Office action dated Jan. 11, 2008, from U.S. Appl. No. 10/972,025 (published as U.S. Patent Application Publication No. 2005-0120316).

Office action dated Jun. 2, 2008, from U.S. Appl. No. 10/972,025 (published as U.S. Patent Application Publication No. 2005-0120316).

Okhmatovski et al., "Evaluation of Layered Media Green's Functions via Rational Function Fitting," *IEEE Microwave and Wireless Components Letters*, vol. 14, No. 1, pp. 22-24 (Jan. 2004).

Soitec, "Wafer Solutions by Application," downloaded from http://www.soitec.com/en/products/, 2 pp. (document marked 2009).

Srivastava et al., "Analytical Expressions for High-Frequency VLSI Interconnect Impedance Extraction in the Presence of a Multilayer Conductive Substrate," *IEEE Trans. on Computer-Aided Design of Integrated Circuits and Systems*, vol. 28, No. 7, pp. 1047-1060 (Jul. 2009).

Srivastava et al., "High-Frequency Mutual Impedance Extraction of VLSI Interconnects in the Presence of a Multi-Layer Conducting Substrate," *Design, Automation and Test in Europe*, pp. 426-431 (2008).

Suaya et al., "Modeling and Extraction of Nanometer Scale Interconnects: Challenges and Opportunities," *Proc. 23rd Advanced Metallization Conf.*, 11 pp. (2006).

Verghese et al., "Substrate Coupling in Mixed-Mode and RF Integrated Circuits," *IEEE*, pp. 297-303 (Sep. 1997).

Verghese et al., "SUBTRACT: A Program for the Efficient Evaluation of Substrate Parasitics in Integrated Circuits," *IEEE*, pp. 194-198 (Nov. 1995).

Verghese et al., "Verification of RF and Mixed-Signal Integrated Circuits for Substrate Coupling Effects," *IEEE Custom Integrated Circuits Conf.*, pp. 363-370 (May 1997).

Verghese et al., "Verification Technique for Substrate Coupling and Their Application to Mixed-Signal IC Design," *IEEE*, vol. 31, No. 3, pp. 354-365 (Mar. 1996).

Weisshaar et al., "Accurate Closed-Form Expressions for the Frequency-Dependent Line Parameters of On-Chip Interconnects on Lossy Silicon Substrate," *IEEE Trans. on Advanced Packaging*, vol. 25, No. 2, pp. 288-296 (May 2002).

Yang et al., "Discrete Complex Images of a Three-Dimensional Dipole Above and Within a Lossy Ground," *IEE Proc. H Microwaves, Antennas, and Propagation*, vol. 138, No. 4, pp. 319-326 (Aug. 1991).

Yavuz et al., "Critical Study of the Problems in Discrete Complex Image Method," *IEEE Int'l Symp. on Electromagnetic Compatability*, pp. 1281-1284 (2003).

Ymeri et al., "New Analytic Expressions for Mutual Inductance and Resistance of Coupled Interconnects on Lossy Silicon Substrate," *Topical Meeting on Silicon Monolithic Integrated Circuits in RF Systems*, pp. 192-200 (2001).

Yuan et al., "A Direct Discrete Complex Image Method from the Closed-Form Green's Functions in Multilayered Media," *IEEE Trans. on Microwave Theory and Techniques*, vol. 54, No. 3, pp. 1025-1032 (Mar. 2006).

"ASITIC: Analysis and Simulation of Spiral Inductors and Transformers for ICs," downloaded from http://rfic.eecs.berkeley.edu/~niknejad/asitic.html, 1 p., Feb. 23, 2009.

"ASITIC Documentation: Grackle Release," downloaded from http://rfic.eecs.berkeley.edu/~niknejad/doc-05-26-02/asitic.html, 1 p.

"ASITIC Commands," downloaded from http://rfic.eecs.berkeley.edu/~niknejad/doc-05-26-02/commands.html, 1 p.

"ASITIC Documentation: Environmental Variables," downloaded from http://rfic.eecs.berkeley.edu/~niknejac/doc-05-26-02/env.html, 8 pp.

"ASITIC: Installing and Running," downloaded from http://rfic.eecs.berkeley.edu/~niknejad/doc-05-26-02/install.html, 2 pp.

"Technology File," downloaded from http://rfic.eecs.berkeley.edu/~niknejad/doc-05-26-02/techfile.html, 5 pp.

"ASITIC Quickstart," downloaded from http://rfic.eecs.berkeley.edu/~niknejad/doc-05-26-02/quickstart.html, 3 pp.

"Sample ASITIC Sessions," downloaded from http://rfic.eecs.berkeley.edu/~niknejad/doc-05-26-02/sample.html, 19 pp.

"ASITIC FAQ," downloaded from http://rfic.eecs.berkeley.edu/~niknejad/doc-05-26-02/faq.html, 7 pp.

Averill III et al., "Chip integration methodology for the IBM S/390 G5 and G6 custom microprocessors," *IBM J. Res. Develop.*, vol. 43, pp. 681-706 (Sep./Nov. 1999).

Banerjee et al., "Accurate Analysis of On-Chip Inductance Effects and Implications for Optimal Repeater Insertion and Technology Scaling," *IEEE Symposium on VLSI Circuits*, Kyoto, Japan, pp. 1-4 (Jun. 14-16, 2001).

Beattie et al., "Efficient Inductance Extraction via Windowing," *Proc. Design, Automation, and Test in Europe*, pp. 430-436 (2001).

Beattie et al., "Equipotential shells for efficient inductance extraction," *IEEE Trans. CAD of IC and Systems*, vol. 20, pp. 70-79 (2001).

Beattie et al., "Hierarchical Interconnect Circuit Models," 7 pp. (also published as Beattie et al., "Hierarchical Interconnect Circuit Models,"*Proc. ICCAD*, pp. 215-221 (Nov. 2000)).

Beattie et al., "Inductance 101: Modeling and extraction," *Design Automation Conference*, pp. 323-328 (2001).

Belk et al., "The Simulation and Design of Integrated Inductors," *ACM*, 6 pp. (Jun. 1999).

Burghartz et al., "On the Design of RF Spiral Inductors on Silicon," *IEEE Trans. on Electron Devices*, vol. 50, No. 3, pp. 718-729 (Mar. 2003).

Chang et al., "Clocktree RLC Extraction with Efficient Inductance Modeling," 5 pp. (also published as Chang et al., "Clocktree RLC Extraction with Efficient Inductance Modeling," *Proc. Design, Automation, and Test in Europe*, pp. 522-526 (2000)).

Chen et al., "Inductwise: Inductance-wise interconnect simulator and extractor," *IEEE Transactions, Computer-Aided Design of Integrated Circuits and System*, vol. 22, No. 7, pp. 884-894 (2003).

Davis et al., "Compact Distributed RLC Interconnect Models—Part I: Single Line Transient, Time Delay, and Overshoot Expressions," *IEEE Trans. on Electron Devices*, vol. 47, No. 11, pp. 2068-2077 (Nov. 2000).

Devgan et al., "How to efficiently capture on-chip inductance effects: Introducing a new circuit element κ," *Computer Aided Design, IEEE/ACM International Conference*, pp. 150-155 (Nov. 2000).

Escovar et al., "Mutual Inductance between Intentional Inductors: Closed Form Expressions," *IEEE*, pp. 2445-2448 (2006).

Escovar et al., "Mutual Inductance Extraction and the Dipole Approximation," *ACM*, pp. 162-169 (2004).

Escovar et al., "Transmission line design of clock trees," *Proc. IEEE/ACM International Conference on CAD*, pp. 334-340 (Nov. 2002).

Gala et al., "Inductance 101: Analysis and Design Issues," *Design Automation Conf.*, pp. 329-334 (Jun. 2001).

Gieseke et al., "A 600 MHz Superscalar RISC Microprocessor with Out-Of-Order Execution," *IEEE International Solid-State Circuits Conf.*, pp. 176, 177, and 451 (Feb. 1997).

Golub et al., "The Differentiation of Pseudo-Inverses and Nonlinear Least Squares Problems Whose Variables Separate," *SIAM J. Numer. Anal.*, vol. 10, No. 2, pp. 413-432 (Apr. 1973).

Grover, *Inductance Calculations: Working Formulas and Tables*, pp. iii-xiv, 1, 31-61 (1946).

Gupta et al., "Hierarchical Modeling of Electrostatic and Magnetostatic Couplings," 4 pp. (also published as Gupta et al., "Hierarchical Modeling of Electrostatic and Magnetostatic Couplings," *SRC Techcon Conference* (Aug. 2003)).

Gupta, "Modeling Inductive Couplings in Traditional and Nanoscale Interconnects," Ph.D. Thesis, Carnegie Mellon University, 83 pp. (Jul. 2004).

Hu et al., "Analysis of Full-Wave Conductor System Impedance over Substrate Using Novel Integration Techniques," *ACM*, pp. 147-152 (Jun. 2005).

Ismail et al., "Effects of Inductance on the Propagation Delay and Repeater Insertion in VLSI Circuits," *IEEE Trans. on VLSI Systems*, vol. 8, No. 2, pp. 195-206 (Apr. 2000).

Jackson et al., *Classical Electrodynamics*, pp. xi-xvii, 144-149 (1962).

Jiang et al., "On-Chip Spiral Inductors Suspended over Deep Copper-Lined Cavities," *IEEE Trans. on Microwave Theory and Techniques*, vol. 48, No. 12, pp. 2415-2423 (Dec. 2000).

Kamon, "Efficient Techniques for Inductance Extraction of Complex 3-D Geometries," Master Thesis—Massachusetts Institute of Technology, 80 pp. (Feb. 1994).

Kamon et al., "Fasthenry: A multipole-accelerated 3-d inductance extraction program," *IEEE Trans. Microwave Theory Tech.*, vol. 42, No. 9, pp. 1750-1758 (Sep. 1994).

Krauter et al., "Layout based frequency dependent inductance and resistance extraction for on-chip interconnect timing analyis," *Proc. 35th ACM/IEEE DAC*, pp. 303-308 (Jan. 1998).

Lee et al., "Interconnect Inductance Effects on Delay and Crosstalks for Long On-Chip Nets with Fast Input Slew Rates," *IEEE*, pp. II-248 through II-251 (1998).

Lin et al., "On the efficiency of simplified 2d on-chip inductance models," *Design Automation Conference*, pp. 757-762 (2002).

Lopera et al., "A Multiwinding Modeling Method for High Frequency Transformers and Inductors," *IEEE Trans. on Power Electronics*, vol. 18, No. 3, pp. 896-906 (May 2003).

Lu et al., "A Fast Analytical Technique for Estimating the Bounds of On-Chip Clock Wire Inductance," *IEEE CICC*, 4 pp. (2001).

Lu et al., "Min/max On-Chip Inductance Models and Delay Metrics," *Design Automation Conf.*, pp. 341-346 (2001).

Massoud et al., "Layout Techniques for Minimizing On-Chip Interconnect Self Inductance," *Design Automation Conf.*, pp. 566-571 (1998).

Niknejad et al., "Analysis and Optimization of Monolithic Inductors and Transformers for RF ICs," *IEEE*, pp. 375-378 (May 1997).

Niknejad et al., "Analysis, Design, and Optimization of Spiral Inductors and Transformers for Si RF IC's," *IEEE J. of Solid-State Circuits*, vol. 33, No. 10, pp. 1470-1481 (Oct. 1998).

Niknejad et al., *Design, Simulation and Applications of Inductors and Transformers for Si RF ICs*, pp. 64-69 (2000).

Office action dated Jun. 25, 2008, from related U.S. Appl. No. 11/435,426.

Qi et al., "On-Chip Inductance Modeling of VLSI Interconnects," *IEEE Solid-State Circuits Conf.*, 12 pp. (2000).

Ranjan et al., "Use of Symbolic Performance Models in Layout-Inclusive RF Low Noise Amplifier Synthesis," *IEEE*, pp. 130-134 (Sep. 2004).

Restle et al., "A Clock Distribution Network for Microprocessors," *IEEE Journal of Solid-State Circuits*, vol. 36, No. 5, pp. 792-799 (May 2001).

Rosa, "The Self and Mutual Inductance of Linear Conductors," *Bulletin of the National Bureau of Standards*, vol. 4, pp. 301-344 (1908).

Ruehli, "Inductance calculations in a complex circuit environment," *IBM J. Res. Develop.*, vol. 16, pp. 470-481 (1972).

Sakurai, "Closed-Form Expressions for Interconnection Delay, Coupling, and Crosstalk in VLSI's," *IEEE Trans. on Electron Devices*, vol. 40, No. 1, pp. 118-124 (Jan. 1993).

Yue et al., "Design Strategy of On-Chip Inductors for Highly Integrated RF Systems," *ACM*, 6 pp. (Jun. 1999).

Office action dated Sep. 19, 2012, from U.S. Appl. No. 13/525,107 (published as U.S. Patent Application Publication No. 2012-0254814).

Office action dated Nov. 19, 2012, from U.S. Appl. No. 13/448,116 (published as U.S. Patent Application Publication No. 2012-0204139).

Final Office action dated Aug. 25, 2011, from U.S. Appl. No. 11/435,426 (published as U.S. Patent Application Publication No. 2006/0282492).

Office action dated Aug. 11, 2011, from U.S. Appl. No. 12/400,672 (published as U.S. Patent Application Publication No. 2009-0228847).

Office action dated Oct. 18, 2011, from U.S. Appl. No. 12/400,672 (published as U.S. Patent Application Publication No. 2009-0228847).

Notice of Allowance dated Dec. 14, 2011, from U.S. Appl. No. 11/435,426 (published as U.S. Patent Application Publication No. 2006-0282492).

Notice of Allowance dated Mar. 5, 2012, from U.S. Appl. No. 12/400,672 (published as U.S. Patent Application Publication No. 2009-0228847).

\* cited by examiner

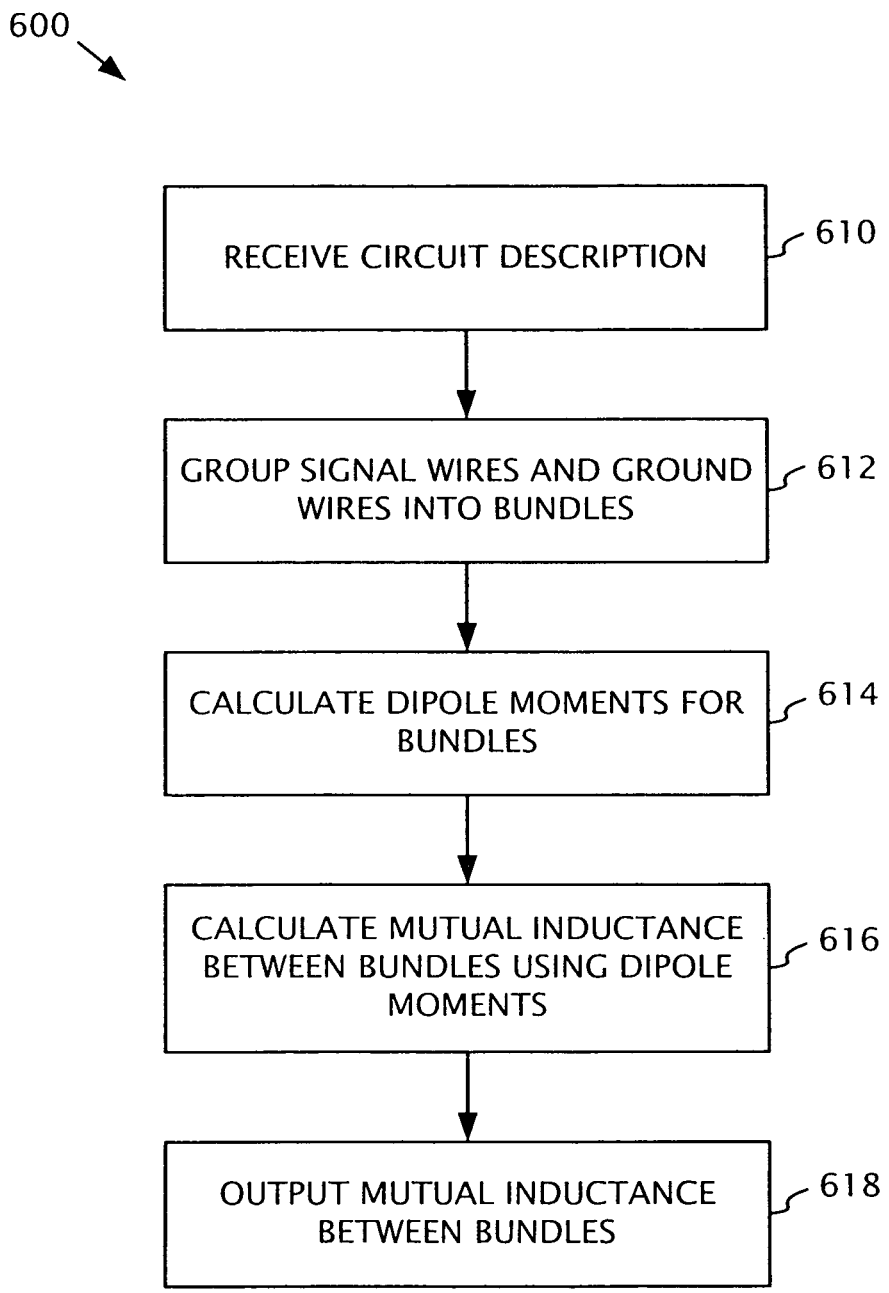

FIG. 17
1700
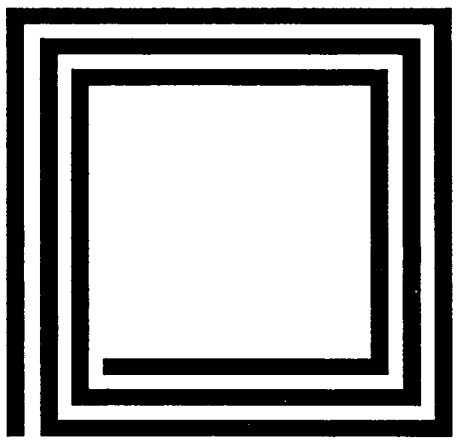
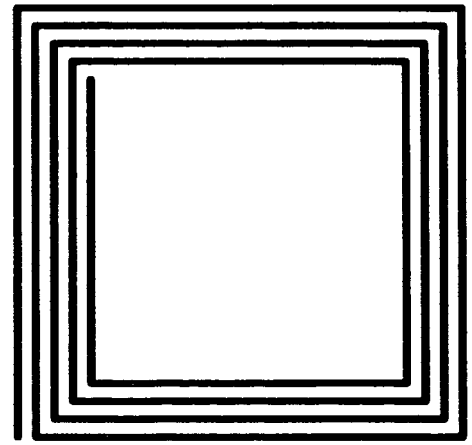
INDUCTOR *a*          INDUCTOR *b*

INDUCTOR a

FIG. 19
1900
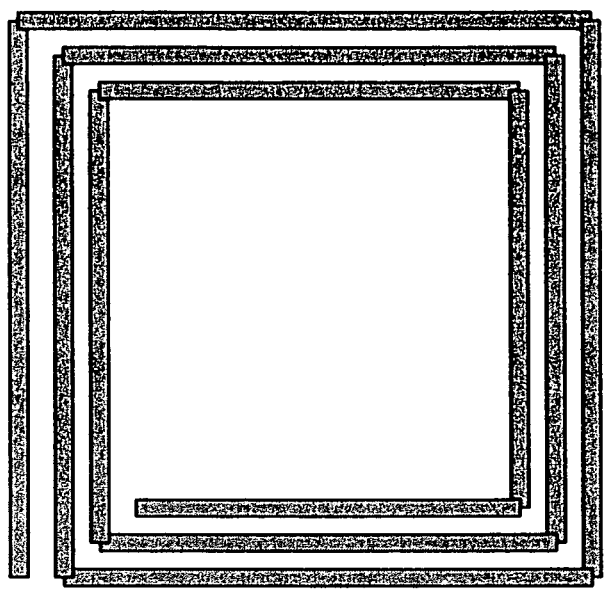
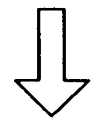
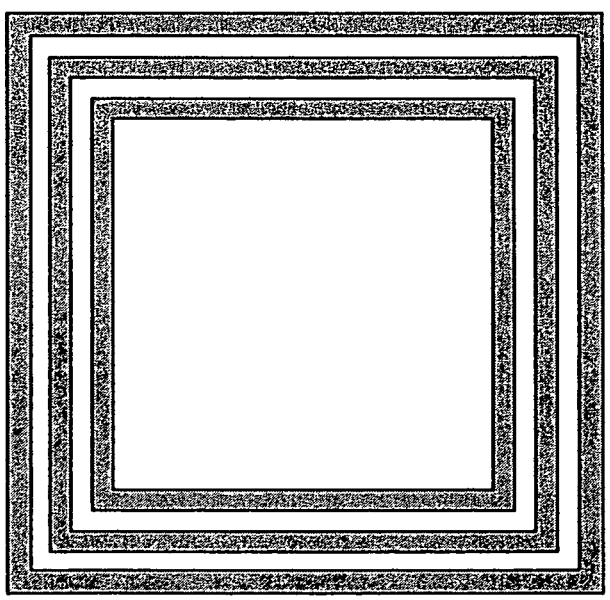

MUTUAL INDUCTANCE EXTRACTION USING DIPOLE APPROXIMATIONS

CROSS REFERENCE TO RELATED APPLICATION

This application is a continuation of U.S. application Ser. No. 10/972,025, filed Oct. 21, 2004 now U.S. Pat. No. 7,496,874, which claims the benefit of U.S. Provisional Patent Application No. 60/513,343, filed on Oct. 21, 2003, both of which are incorporated herein by reference.

BACKGROUND

As operating frequencies of integrated circuits continue to rise, the effects of parasitic inductance on circuit performance are becoming increasingly important. For example, for integrated circuits operating near or above the gigahertz frequency range, the mutual inductance with neighboring signal wires may create signal-integrity problems (such as noise and cross talk). Consequently, the effective modeling and analysis of mutual inductance has become an issue of great interest for high-speed circuit designers and for electronic design automation (EDA) software vendors that develop the tools used to create, simulate, verify, and optimize the designs of integrated circuits (e.g., RF circuits comprising intentional inductors) and to provide bounds for parasitic effects due to inductance.

SUMMARY

Disclosed below are representative embodiments of methods for extracting mutual inductance using a dipole approximation technique. The disclosed methods should not be construed as limiting in any way. Instead, the present disclosure is directed toward all novel and nonobvious features and aspects of the various disclosed embodiments, alone and in various combinations and subcombinations with one another. The methods are not limited to any specific aspect or feature or combinations thereof, nor do the disclosed methods require that any one or more specific advantages be present or problems be solved.

According to one exemplary embodiment, a method for analyzing mutual inductance in a circuit is disclosed. In this embodiment, a description of the circuit is received, the description being indicative of the layout of signal wires and ground wires in the circuit. At least a portion of the signal wires and the ground wires are grouped into at least a first bundle and a second bundle. The first bundle and the second bundle each comprise a respective signal-wire segment and one or more corresponding ground-wire segments. A representative dipole moment is calculated for the first bundle. The mutual inductance between the first bundle and the second bundle is calculated using the representative dipole moment. In certain implementations, the grouping is performed such that the one or more ground-wire segments of the first and second bundles have the same length as and are parallel to their respective signal-wire segments. Further, the one or more corresponding ground-wire segments in the first bundle and the second bundle can desirably be identified as being return paths for their respective signal-wire segments based at least in part on their resistance and separation from their respective signal-wire segment. The representative dipole moment of this embodiment may comprise the weighted average of dipole moments resulting from individual current loops in the first bundle, each individual current loop comprising the signal-wire segment of the first bundle and a respective one of the corresponding ground-wire segments of the first bundle. Further, the act of calculating the mutual inductance may comprise calculating the magnetic flux due to the representative dipole moment of the first bundle through surfaces in the second bundle formed between the respective signal-wire segment of the second bundle and the corresponding ground-wire segments of the second bundle, and a weighted average of the respective contributions of the surfaces. Some implementations of the method according to this embodiment further comprise determining whether a distance between the first bundle and the second bundle is greater than a threshold distance, and calculating the mutual inductance only if the distance is greater than the predetermined distance (e.g., 20 micrometers).

Another disclosed embodiment is a method for analyzing inductance in an integrated circuit layout in an electronic design automation (EDA) software environment. In this embodiment, signal-wire segments and ground-wire segments of the integrated circuit layout are fractured into at least a first bundle and a second bundle. The first bundle and the second bundle each comprise a respective signal-wire segment and one or more corresponding ground-wire segments parallel to and of a same length as the respective signal-wire segment. A distance between the first bundle and the second bundle is desirably evaluated. The mutual inductance between the first bundle and the second bundle is desirably calculated using the dipole approximation technique if the distance between the first bundle and the second bundle is larger than a threshold distance (e.g., roughly 20 micrometers at 130 nanometer technologies). In certain implementations of this embodiment, the dipole approximation technique comprises representing the magnetic fields created between the signal wire and each corresponding ground wire of the first bundle as a single magnetic field created by a magnetic dipole. In these implementations, a dipole moment of the magnetic dipole desirably can comprise the weighted average of dipole moments resulting from individual current loops in the first bundle, each individual current loop comprising the signal-wire segment of the first bundle and a respective one of the corresponding ground-wire segments.

Any of the above-described methods might also comprise evaluating whether a configuration of the corresponding ground-wire segments of the first bundle is symmetrical with respect to the signal-wire segment of the first bundle, and determining whether to perform the mutual inductance calculations based at least in part on this evaluation. In certain implementations, the method may include evaluating whether a dipole-moment direction of the first bundle is substantially the same as a dipole-moment direction of the second bundle and whether the angle between a perpendicular line to this direction and the line joining the centers of mass of the two bundles is substantially equal to a fixed amount (e.g., between 35° and 45°), and determining whether to perform the mutual inductance calculations based at least in part on this evaluation. The method may also comprise evaluating whether a dipole moment of the first bundle is substantially perpendicular to a dipole moment of the second bundle and whether the relative position of the first bundle to the second bundle is such that a center of the second bundle is located substantially on an axis extending through the dipole moment of the first bundle, and determining whether to perform the mutual inductance calculations based at least in part on this evaluation. The methods are not limited to these exemplary approaches.

In another disclosed method for determining inductance in an integrated circuit layout, magnetic fields created by current loops between a signal-wire segment and one or more associated return-path segments are represented as a single dipole moment. The magnetic flux of the single magnetic field through a surface spanned between a distant signal-wire segment and an associated distant return-path segment is determined. The mutual inductance between the current loops associated with the signal-wire segment (sometimes referred to as the "aggressor") and a current loop associated with the return-path segment (sometimes referred to as the "victim") is output, the mutual inductance being based at least in part on the determined magnetic flux. In certain embodiments, the representative dipole moment comprises the weighted average of respective dipole moments between the signal-wire segment and the associated return-path segments. In some embodiments, the associated return-path segments of the first bundle are identified as being return paths for the signal-wire segment based at least in part on their resistance and separation from the signal-wire segment. The method may further comprise evaluating a distance between the first bundle and the second bundle and performing the method only if the distance is greater than a predetermined distance (e.g., 20 micrometers).

In certain disclosed embodiments, the dipole approximation method can be applied to compute the mutual inductance between intentional inductors, such as those that frequently occur in RF analog or mixed-signal integrated circuits or systems on a chip (SOCs). In these embodiments, the bundles identified generally comprise two opposite segments within the same turn in an intentional inductor that carry the same current in opposite directions.

The disclosed embodiments are not constrained to being applied to a Manhattan layout, but may more generally be applied to layouts having other angular relationships.

Any of the disclosed methods may be performed by a computer program, such as an electronic-design-automation (EDA) software tool comprising computer-executable instructions stored on a computer-readable medium. Further, any of the disclosed methods can be used to modify or design a circuit represented as circuit design information stored on a computer-readable medium. The circuit design information can comprise, for example, a circuit design database (such as a GDSII or Oasis file) and may be created or modified on a single computer or via a network. Additionally, data structures or design databases storing mutual inductance information determined using any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 3B shows the cross section of the exemplary bundle. FIGS. 3A and 3B further illustrate the magnetic dipole that is representative of the exemplary bundle.

FIG. 4B shows the cross section of the exemplary bundle. FIG. 4A and FIG. 4B further illustrate the individual magnetic dipoles formed between the signal wire and the respective ground wires.

FIG. 6 is a flowchart of an exemplary method for analyzing the mutual inductance between two bundles using an embodiment of the disclosed dipole approximation technique.

FIG. 17 is a block diagram showing an exemplary configuration consisting of two different inductors.

FIG. 19 is a block diagram showing an exemplary transformation of an inductor into concentric polygons in order to calculate its dipole moment.

FIG. 20 also shows the results obtained from a field solver for the same configuration (solid line).

DETAILED DESCRIPTION

Figure 1:
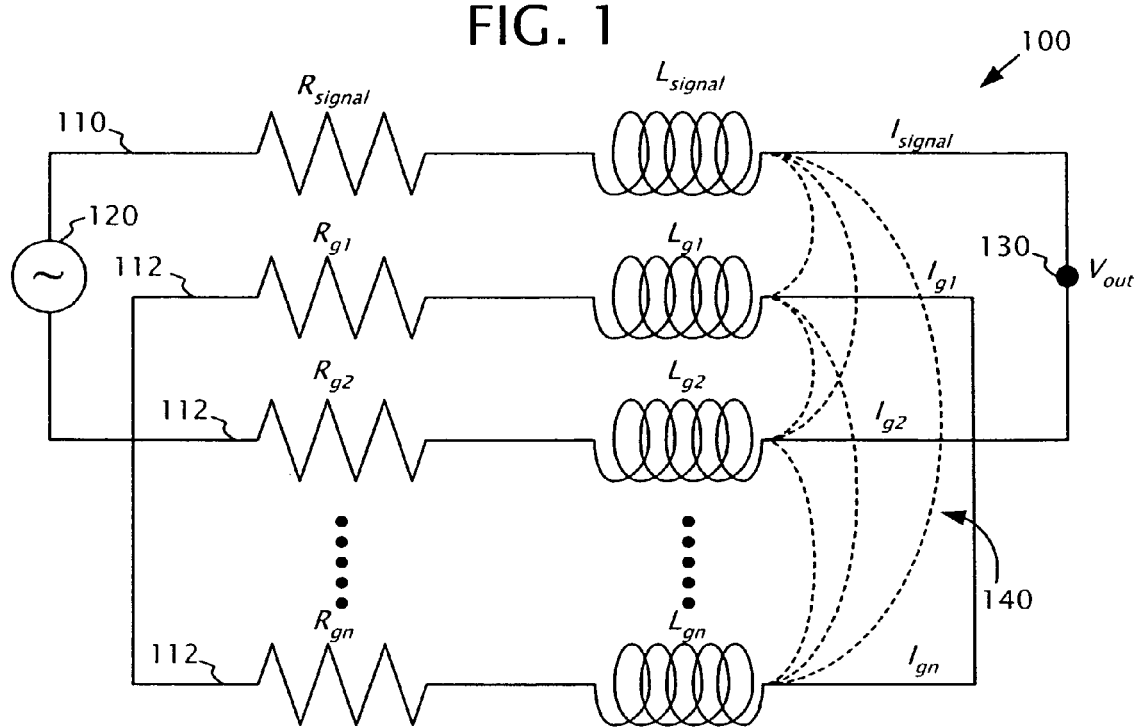
FIG. 1 is a block diagram of an exemplary wiring layout illustrating the various couplings between an exemplary signal wire and its multiple return paths.

Disclosed below are representative embodiments of methods for extracting mutual inductance using a dipole approximation technique. The disclosed methods should not be construed as limiting in any way. Instead, the present disclosure is directed toward all novel and nonobvious features and aspects of the various disclosed embodiments, alone and in various combinations and subcombinations with one another. The methods are not limited to any specific aspect or feature or combinations thereof, nor do the disclosed methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "receive" and "group" to describe the disclosed methods. These terms are high-level abstractions of the actual operations that are performed. The actual operations that correspond to these terms will vary depending on the particular implementation and are readily discernible by one of ordinary skill in the art.

The disclosed technology can be applied, for example, to the analysis of inductance noise among intentional inductors as commonly used on RF analog or mixed-signal integrated circuits. The disclosed technology can be used, for example, to minimize the noise due to mutual inductance by performing simple displacement operations on the inductors so as to satisfy noise margins. It can also be used in the reverse sense (i.e., by grouping intentional inductors closer together to improve yield) while simultaneously satisfying noise limits.

The disclosed embodiments can be applied to any circuit or situation where parasitic inductance may affect signal delay or signal integrity. For example, the disclosed embodiments can be used to analyze the long distance behavior of inductance in the on-chip interconnect of an integrated circuit (e.g., an application-specific integrated circuit (ASIC), a programmable logic device (PLDs) such as a field programmable gate arrays (FPGA), a system-on-a-chip (SoC), or a microprocessor) or in the off-chip interconnect at the board or package level (e.g., multilayered packages or printed circuit boards).

Any of the disclosed methods can be performed using software stored on a computer-readable medium and executed on a computer. Such software can comprise, for example, an electronic-design-automation (EDA) software tool used, for instance, for physical verification or synthesis. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

Further, any of the disclosed methods can be used to modify or design a circuit represented as circuit design information stored on computer-readable media. The circuit design information can comprise, for example, a design database (such as a GDSII or Oasis file) and may be created or modified on a single computer or via a network. Additionally, mutual inductance information determined using any of the disclosed methods may be included in one or more data structures or design databases stored on computer-readable media.

The disclosed methods can be used at one or more stages of an overall synthesis scheme. For example, any of the inductance analysis methods disclosed can be used during physical synthesis (e.g., during the physical verification process) in order to evaluate and improve the implemented design.

The Partial-Inductance and Loop-Inductance Approaches in General

In general, there are two common approaches for analyzing parasitic inductance in the paths of an integrated circuit. These two approaches may be categorized as: (1) the loop-inductance approach; and (2) the partial-inductance approach (sometimes termed the partial-element-equivalent-circuits (PEEC) model). The disclosed embodiments generally concern methods for efficiently calculating mutual inductances using the loop-inductance approach. More specifically, certain embodiments of the disclosed technology concern calculating mutual inductances in terms of the magnetic fields generated by magnetic dipoles that are representative of current loops in the layout of signal wires and ground wires in an integrated circuit design. Before describing the disclosed methods, however, a brief discussion of the loop-inductance approach and the partial-inductance approach, as well as some of the problems of the partial-inductance approach (e.g., the high density of its inductance matrix (M)), is provided.

In both approaches, the energy W associated with a set of two currents $I_i$ and $I_j$ running along loops $C_i$ can be found as follows:

$$W = \frac{1}{2} \sum_i \sum_j W_{ij}, \qquad (1)$$

and $$W_{ij} = I_i I_j M_{ij},$$

where $M_{ij}$ is the i, j element of the inductance matrix. The inductance matrix element $M_{ij}$ can be determined as follows:

$$\begin{aligned} M_{ij} &= \frac{\Psi_{i \to j}}{I_i} \\ &= \frac{1}{I_i} \int_{S_j} B^{(i)} \cdot dS_j \\ &= \frac{\mu_0}{4\pi} \left( \oint_{C_i} \oint_{C_j} \frac{dl_i \, dl_j}{|r_i - r_j|} \right)_{\substack{conductors' \\ cross-sections}}, \end{aligned} \qquad (2)$$

where $\Psi_{i \to j}$ is the magnetic flux due to the magnetic induction field $B^{(i)}$, $S_j$ is the surface bounded by $C_j$, generated by the time-varying current $I_i$ acting on $I_j$. In Equation (2), the quasimagneto-static regime is assumed, so the currents $I_i$, $I_j$ are considered to be uniform over the transverse cross sections and it is possible to equalize the last two equations.

In the loop-inductance approach, the integrals in Equation (2) can be evaluated over closed loops. By contrast, in the partial-inductance approach, the loops are segmented, and each segment is assumed to form part of a loop that closes at infinity. Because the partial-inductance approach includes mutual inductances between every pair of conductors in the circuit design, the resulting matrix can be very dense.

The denseness of the partial-inductance matrix is primarily due to the long distance behavior of the partial inductance matrix M, which is essentially non-physical. In fact, for large wire separations r, the per unit length matrix element $m_{ij}$ behaves as:

$$m_{ij}(r) \equiv \frac{M_{ij}(r)}{L} \sim -\log(r), \quad (3)$$

where L is their common length.

The logarithmic decrease with distance manifests itself in two-dimensional as well as three-dimensional treatments. In the three-dimensional case, however, the constant coefficient log(2L) appears, which is absent in the two-dimensional case. Using Grover's equations (see F. Grover, *Inductance Calculations Working Formula and Tables*, New York: Instrument Society of America (1945)), it can be shown that the ratio of $M_{ij}$ between a filament i and its neighbor j to the corresponding diagonal term $L_i$ has the following limit at large distances (for large r, r<L):

$$\frac{M}{L} \sim 1 - \frac{\log(r/w)}{\log(2L)} \to 1, \quad (4)$$

where w represents the cross section of the wire (e.g., the width of a square signal trace).

Equations (3) and (4) result in M being dense and not diagonally dominant. A strictly diagonally dominant real matrix is one in which the sum of the absolute values of off-diagonal elements for each row is strictly smaller than the absolute value of the diagonal counterparts. For a symmetric matrix with diagonal elements that are strictly positive, diagonal dominance is a sufficient condition for the matrix having real and strictly positive eigenvalues. Moreover, neglecting small off-diagonal terms in a matrix of this type does not change the sign of its eigenvalues. Matrices of this kind can be sparsified by neglecting small off-diagonal terms, without resulting in a possible passivity violation. Positive definite matrices that do not satisfy the requirement of being strictly diagonally dominant, on the other hand, can display unwanted instabilities of the following kind: setting to zero seemingly negligible off-diagonal contributions can alter the sign of the eigenvalues of M, a violation of passivity for linear systems. A system designer is then left with two unwanted choices when working with M (particularly with respect to the PEEC method): either sparsify and have passivity violations, or have very large matrices and rapidly increase the complexity of downstream circuit simulation.

To investigate the primary source of the denseness of the partial-inductance matrix, consider the following proposition: the asymptotic behavior of the partial-inductance model shown in Equation (3) results from the following large distance behavior of B:

$B(d) \sim 1/r^2$ in three dimensions, and $B(d) \sim 1/r$ in two dimensions. (5)

This first proposition can be verified by directly substituting Equation (5) into Equation (2), and counting powers in the integrand to estimate the asymptotic behavior.

The first proposition is based on a second proposition: the asymptotic behavior of Equation (5) results from the presence of unbounded current distributions. To show the basis for this second proposition, consider Ampere's law in the two-dimensional case for an infinitely long filament:

$\int B \cdot dl = \mu_0 I$. (6)

Extracting B gives:

$$B(r) = \frac{\mu_0 I}{2\pi r} \quad (7)$$

$$m(r) = \frac{\int B dr}{I} = \frac{\mu_0}{2\pi} \log\left(\frac{r}{w}\right),$$

which gives Equation (3).

In the three-dimensional case, consider the vector potential A:

$$A(r) = \frac{\mu_0}{4\pi} \int_V \frac{J(r')}{|r-r'|} d^3 r', \quad (8)$$

and carry out a multi-pole expansion of Green's Function:

$$\frac{1}{|r-r'|} = \frac{1}{|r|} + \frac{r \cdot r'}{|r|^3} + \ldots, \quad (9)$$

giving:

$$A_i(r) = \frac{\mu_0}{4\pi}\left(\frac{1}{|r|}\int_V J_i(r') d^3 r' + \frac{r}{|r|^3}\int_V r' J_i(r') d^3 r' + \ldots\right). \quad (10)$$

For $B(r) \approx 1/r^2$ (which is required from Equation (3)), the first terms in Equation (10) must be different than zero. On the other hand, it is known that for any bounded current distribution in the quasi-static regime where $$\frac{\partial \rho}{\partial t} = 0,$$

with ρ being the charge density, the integral in the first term of Equation (10) vanishes (the volume V of integration includes the entire current distribution). Thus, under quasi-static conditions and for bounded current distributions, the value of A will decrease for large distances at least as rapidly as $1/r^2$. Using B=∇×A, it can be concluded for bounded physical systems that:

$B \sim 1/r^3$. (11)

This result suggests that Equations (3) and (5) are invalid and indicates that the partial-inductance method is in violation with the asymptotic behavior required by Maxwell's equations. Consequently, one of the underlying assumptions (bounded current distributions or quasi-static conditions) of the partial-inductance model needs to be removed. Dropping the assumption of bounded current distributions, however, suggests the presence of magnetic monopoles, but dropping the quasi-static assumption requires a complete reformulation of the approach. Thus, the behavior in Equation (5) within the partial-inductance model is only understood by accepting the existence of magnetic monopoles in violation of Maxwell's equations. In the partial-inductance model, the correct physical behavior of electromagnetic theory is recovered downstream during the circuit simulation phase of the flow. During this phase, circuits are necessarily closed by virtue of the Kirchoff Voltage Laws (KVL). An inherent result of the method is that large cancellations involving different length scales occur, mixing short distance with long distance. Although the correct physical theory is recovered, the size of the mutual inductance matrix needed for timing simulation is increased. Issues related to capacity and numerical accuracy are unavoidable in this model. By contrast, the loop-inductance model preserves the correct physical model for analyzing inductance throughout and utilizes an inductance matrix that is substantially less dense than in the partial-inductance model.

There have been numerous efforts made to improve the partial-inductance model. The underlying goal of many of these efforts has been to sparsify the dense M matrix while preserving the positive definiteness of the matrix. The behavior of magnetic fields within the partial-inductance formalism (magnetic fields being produced by magnetic monopoles) is formally equivalent to that of electrical fields being produced by point charges. This similarity has inspired some researchers to explore the notion of inverse methods. Generally speaking, these methods usually consist of first inverting locally the M matrix, then sparsifying the $K \equiv M^{-1}$ matrix. The analogy extends to C and K, which play similar roles in the electrostatic and magneto-static problems, respectively (that is, $Q=C\Delta V$, $j\omega l=K\Delta V$). However, there is an important difference between the two cases: for the C matrix, the local truncation prior to inversion is well justified due to the fact that C, in the Maxwell sense, is diagonally dominant by construction, and thus any truncation preserves positive definiteness.

At variance with C, the matrix K is not physical, and it is not obvious how to extend the concept of shielding that is present in the electrostatic case. The shielding of electrical fields by conductors causes the electrical field (E) to be localized in a dense-wire environment, thus making the C matrix sparse. In the magneto-quasi-static case, however, there is no physical equivalent to shielding, currents and the magnetic field (B) fully penetrate the conductors. Nonetheless, it can be empirically verified that K is sparse, indicating the strength of using the partial-inductance model followed by inverse methods. A loop inductance method, on the other hand, has inherent localization properties that can be derived while preserving the correct physical theory (as shown and discussed below with respect to Equation (29)).

Positive Definiteness of the Loop Inductance Matrix

Figure 14:
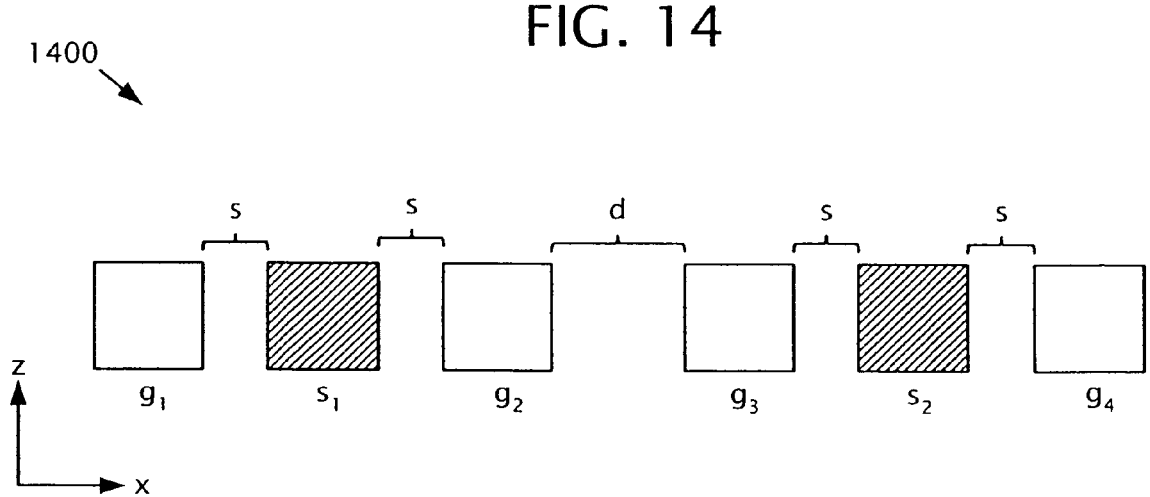
FIG. 14 is a block diagram illustrating a wiring layout having two symmetric signal-wire and ground-wire configurations.

A number of observations can be made that support the position that the loop inductance matrix M is diagonally dominant for configurations where there are no shared return paths. For example, consider an exemplary worst-case configuration, where values of the diagonal elements are as small as possible, and the corresponding values of the off-diagonal elements are as large as possible. FIG. 14 is a block diagram 1400 illustrating a representative worst-case configuration. In FIG. 14, the return path of signal wire $s_1$ consists of the parallel combination of ground wires $g_1$ and $g_2$, while for signal wire $s_2$, it consists of ground wires $g_3$ and $g_4$. To minimize loop self inductance of one signal wire, the corresponding return paths need to be as close as possible to the signal wire. Furthermore, to maximize the mutual loop inductance between the two signals, it is necessary to minimize the distance between the two circuits. The minimum distance for purposes of this example is selected as a value that is typical for 90 nm processes. In particular, the minimum value of inter-wire separation ($s_{min}$) is selected as 0.2 μm for representative wires of low resistance having a wire width (w) of about 1 μm. Assuming that $d=s=s_{min}$ and that the configuration 1400 has equal wire widths (w), the inductance-per-unit-length matrix is:

$$M = \begin{pmatrix} 2.96 & 0.07 \\ 0.07 & 2.96 \end{pmatrix} \text{nh/cm.}$$

The ratio δ of self to mutual inductance for this example is about 42. The above matrix is diagonally dominant. To violate the condition of diagonal dominance, at least δ worst-case circuits separated by $s_{min}$ are needed—an unfeasible configuration.

Consider now, a small increase of 1 μm in the separation (d) between the two initial circuits. As a result, δ climbs to 132. This fast climb reflects the power-law nature of the loop inductance variation with distance (which is discussed below with respect to Equation (29)). For feasible wire densities, the self inductance will be larger than the sum of the magnitudes of the mutual inductances with the other circuits. Therefore, for all practical purposes, the matrix M will be diagonally dominant.

Figure 15:
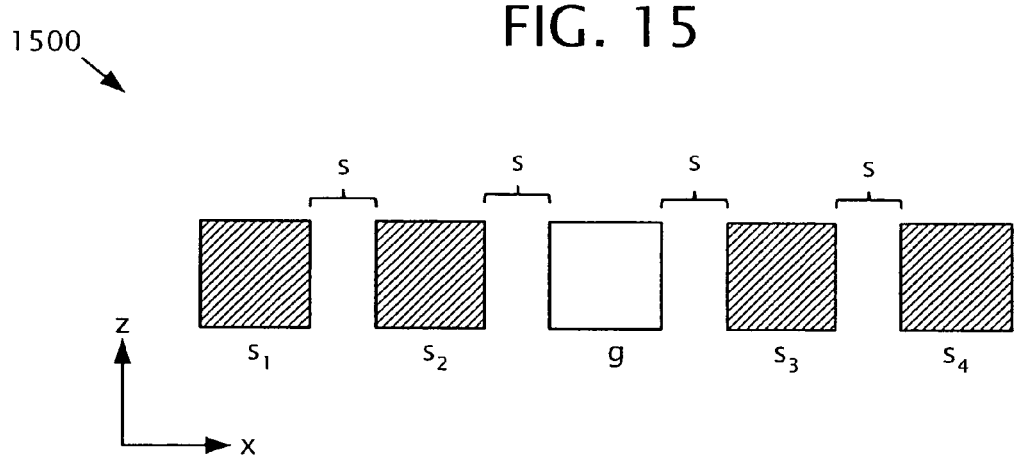
FIG. 15 is a block diagram illustrating a wiring layout having a shared ground wire.

When different signal wires share return grounds, however, the above argument is no longer valid. Consider, for example, the exemplary configuration shown in block diagram 1500 in FIG. 15. Using the same values for the wire separation ($s_{min}$) and width (w) as in the previous example, the following 4×4 matrix results:

$$M = \begin{pmatrix} 7.8 & 3.9 & 1.6 & 2.5 \\ 3.9 & 4.9 & 1 & 1.6 \\ 1.6 & 1 & 4.9 & 3.9 \\ 2.5 & 1.6 & 3.9 & 7.8 \end{pmatrix} \text{nh/cm}$$

This matrix M (calculated from Grover's expressions) is positive definite but not diagonally dominant. It can therefore be concluded that, in the absence of shared ground return paths, the inductance matrix will be diagonally dominant in the loop formalism. This is not the case in the partial inductance formalism, as can be concluded from Equation (4).

In this disclosure, the contributions to the inductance matrix arising from signal-wire segments which are separated by relatively long distances are analyzed and modeled. These wire configurations typically do not lead to shared ground configurations and the resulting diagonal dominance problems.

Return Path Selection

One difference between the partial-inductance model and the loop-inductance model is that the partial-inductance model does not require prior identification of the return paths that are followed by currents in the signal wires. Instead, the partial-inductance model defines each segment of a loop as having its own return loop at infinity. As more fully explained below, however, the uncertainties that may result in the loop-inductance model from this issue are limited to low frequencies, where inductance effects are unimportant.

Throughout this disclosure, the concept of a "bundle" is used. A bundle comprises a set of parallel wires of equal length comprising one signal-wire segment and its possible one or more return-path segments (sometimes referred to herein as "ground-wire segments"). The current loops within a bundle comprise the set of one or more closed loops formed between the return-path segments and one common segment (namely, the signal-wire segment). The set of closed loops may contain only one closed loop if there is only one return-path segment associated to the signal-wire segment. The small segments in the orthogonal direction that close the loops are usually neglected. By contrast, this neglecting is not done in the exemplary embodiment concerning intentional inductors.

According to one exemplary embodiment, bundles can be generated by fracturing a layout database. For example, the path of each signal wire can be decomposed into the union of a set of non-overlapping segments whose ends are identified by discontinuities (changes of layer or direction) either in the signal path or in the path of any of its neighboring return-path segments. Thus, for each signal-path segment, there is a set of one or more return-path (or ground-wire) segments that have the same length and form part of the bundle.

Bundles also have an orientation. For example, in a Manhattan layout, bundles are oriented along the x- and y-axes. Further, different bundles in the same path of a net typically have a different length. The process of selecting return paths can be performed independently for each bundle. When two bundles corresponding to different signals share one or multiple ground-wire segments (that is, have a shared return path or paths), the configuration is said to be a degenerate configuration. The concept of a degenerate configuration for a shared ground is generally applicable at the bundle level only. This means, for example, that two different signal segments of the same wire may belong to two different bundle configurations (for example, one that is degenerate, one that is not). Bundles that are not degenerate can be treated independently from one another. The shared ground configuration discussed above with respect to FIG. 15 is a degenerate configuration and constitutes a very limited subset of all possible shared ground configurations. The criteria that may be used in selecting which ground-wire segments to choose during the bundle-formation process are discussed in more detail below.

Consider the resistance of a bundle (R) and the self inductance of a bundle (L). The frequency dependent impedance of the bundle is given by:

$$Z(\omega) = R + j\omega L. \tag{12}$$

In general, the return path for a particular signal-wire segment is the one that minimizes the impedance (Z). At low frequencies ($\omega$), impedance minimization corresponds to minimizing the resistance (R), whereas for high frequencies ($\omega$), impedance minimization requires minimizing the self inductance (L).

As an example, consider the exemplary wiring configuration shown in FIG. 1. FIG. 1 shows a wiring layout 100 comprising copper wires as may be used for clock signal routing in a 90 nm CMOS process. Assume for purposes of this example that the loop inductance per unit length (l) is $10^{-7}$ H/m, while the loop resistance per unit length (r) is 5000 $\Omega$/m. As illustrated in FIG. 1, wiring layout 100 comprises a signal path 110 (labeled as "signal") and ii return paths 112 (labeled as "$g_1$," "$g_2$," ..., and "$g_n$," respectively). Together, the signal path 110 and the return paths 112 form a loop originating at a voltage source 120 and ending at the node 130 (labeled "$V_{out}$"). The number of possible return paths is not limited, as any number of return paths greater than or equal to one is possible. Each path 110, 112 further includes an associated current (labeled respectively as "$I_{signal}$," "$I_{g1}$," "$I_{g2}$," and "$I_{gn}$"), resistance (labeled respectively as "$R_{signal}$," "$R_{g1}$," "$R_{g2}$," and "$R_{gn}$") and self-inductance (labeled respectively as "$L_{signal}$," "$L_{g1}$," "$L_{g2}$," and "$L_{gn}$"). Each path 110, 112 additionally includes an associated mutual inductance between itself and every other path in the wiring layout 100. For purposes of simplifying the illustration in FIG. 1, these mutual inductances are shown as dotted lines 140 between the mutually coupled paths and are not individually labeled.

With reference to the wiring layout 100 illustrated in FIG. 1, four frequency regimes can be defined:

1. Low frequencies, where r>>$\omega$l (e.g., signal frequencies less than 1 GHz);
2. Intermediate frequencies, where r≥$\omega$l (e.g., signal frequencies less than 8 GHz);
3. High frequencies, where r<$\omega$l and current distribution within the conductors is still uniform (e.g., signal frequencies between 8 and 15 GHz); and
4. Very high frequencies, where r<<$\omega$l and current distribution is no longer uniform (e.g., signal frequencies greater than 15 GHz).

These exemplary frequency ranges should not be construed as limiting, as they are approximate ranges used to illustrate certain behavioral aspects of wiring layouts at various frequencies. In general, the first two regimes are resistance dominated. As the frequency increases into the third regime, however, significant inductance effects begin to appear and are desirably accounted for. To illustrate the impact of these frequency regimes on the return-path selection process, consider the self inductance of a wire configuration in the loop-inductance model having a signal wire and its (not necessarily coplanar) return paths. With reference to FIG. 1, the current $I_i$ running along each return path 112 when a unit amplitude voltage source 120 is connected between the signal and the n return paths of the bundle can be found by:

$$\Delta V = ZI, \tag{13}$$

where, $$\Delta V = \begin{pmatrix} 1 - V_{out} \\ -V_{out} \\ \vdots \\ -V_{out} \end{pmatrix}, I = \begin{pmatrix} I_{signal} \\ I_1 \\ \vdots \\ I_n \end{pmatrix}, \text{ such that } \sum_{i=0}^{n} I_i = 0. \tag{14}$$

These currents $I_i$ give the (complex) weight of each return path within each bundle. Normalized by the current $I_{signal}$, their sum is unity. Further, the value $\alpha_i$ can be defined as:

$$\alpha_i \equiv \frac{I_i}{I_{signal}}. \tag{15}$$

Solving Equation (13) can be computationally expensive when there are a large number of return paths in a bundle because it requires the calculation of the inverse of an (n+1)×(n+1) matrix. Generally, a large number of return paths is needed only for layouts operating in the first regime, where currents can go relatively far from the signal path to find low-resistivity return paths. In this low-frequency regime, however, the inductance component can be neglected in the computation of $I_i$. Thus, for the first regime, $\alpha_i \propto R_i^{-1}$.

For a signal wire operating in the first regime (e.g., less than 1 GHz), the dominant term $R_{loop}$ can be minimized by including as return paths all parallel ground wires ordered by their resistance. For layouts operating in this regime, the distance between signal and ground(s) is typically not important. Return paths that are relatively far away contribute to make the overall inductance large, but the impact of Z is still small since the frequency is relatively low. This balance explains the large possible spread of return path choices. Given two signal wires operating in the first regime, the chances that they have degenerate configurations is relatively high.

For a signal operating in the second regime, where resistance and inductance contributions are of the same order of magnitude but where resistance still dominates, the choice of return path(s) involves a balance between minimizing resistance and minimizing inductance (thus impacting the length of the overall path as well as the separation (d) from the signal wire). According to one exemplary embodiment, a compromise can be obtained by including as return paths wires organized according to resistance up to a maximum distance for the signal wire. This maximum distance may depend on the particular wire configuration and the relevant operating frequency. A weighted function that accounts for both resistances and distances, for example, may be used.

For signals operating in the third regime (e.g., between 8 and 15 GHz), inductance becomes much more important. Further, the set of coefficients $\alpha_i$ computed in Equation (15) and having appreciable contributions will correspond to close-by neighbors, which have a minimal contribution to the loop inductance. In this regime, mutual inductance can be particularly important in signal noise calculations. According to one exemplary embodiment, a predetermined number of the closest neighbors within a certain distance are selected for return paths (e.g., one or two). Alternatively, a weighted function, such as the one described above, may be used with different coefficients. Other functional relationship may also be used to select the return paths.

Finally, for signals in the fourth regime (e.g., greater than 15 GHz), resistance effects become insignificant and desirably may be ignored. In this case, any close neighbor ground or signal can act as a valid return path. Because the number of close ground neighbors is small, full inversion methods are used in one exemplary embodiment to compute $\alpha_i$.

It can be observed from these regimes that, in general, when the current distribution is uniform, loop self inductance decreases with frequency in going from the first regime onwards. In the fourth regime, however, currents cease to be uniform, and there are manifestations of the proximity effect (associated with the skin effect). Selecting a return path configuration from a pool of ground wires is relatively uncomplicated for signals operating in the second, third, and even in the fourth frequency regimes. By using a loop-inductance approach in these regimes, mutual inductance extraction can be performed more efficiently than conventional partial-inductance techniques. Further, by using a loop-inductance approach, the size of the underlying inductance matrix can be decreased because several resistances and inductances in the equivalent circuit representation may be combined together. For example, the method described in R. Escovar and R. Suaya, "Transmission Line Design of Clock Trees," in *Proc. IEEE/ACM International Conference on CAD*, November 2002, pp. 334-340, may be utilized to combine the resistances and the inductances.

Mutual Inductance Analysis Using a Representative Magnetic Dipole

Exemplary embodiments of a method for analyzing mutual inductances utilizing the concept of "bundles" introduced above are described below. To develop a method to compute the mutual inductance between bundles $M_{ab}$ (i.e., the off-diagonal terms in the Z matrix), it is desirable to arrive at an expression for mutual inductance analogous to Equation (1), but for bundles ($M_{ab} = W_{ab}/(I_a I_b)$ for currents $I_a$ and $I_b$ running along the respective signal wires of bundles a and b). For this purpose, consider again Equation (1), where subindexes i and j now represent the wires in bundles a and b, respectively. The current $I_b$ can be divided among the return paths according to the coefficients $\alpha_j$:

$$I_j = \alpha_{b,j} I_b \text{ with } \alpha_{b,0} = 1, \sum_{j \geq 1} \alpha_{b,j} = -1. \tag{16}$$

Consequently, $W_{ab}$ in Equation (1) can be factored as:

$$W_{ab} = \frac{I_b}{2} \sum_{j \geq 1} \alpha_{b,j} \Psi_{a \to j}. \tag{17}$$

Figure 2:
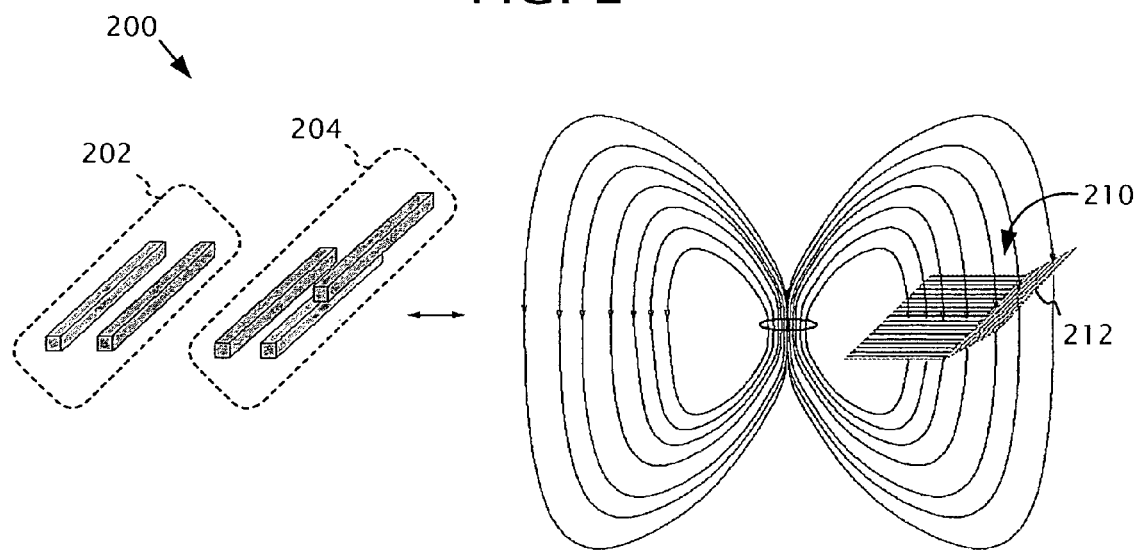
FIG. 2 is a block diagram illustrating the magnetic flux of a first group of current loops through a second group of current loops.

Here, $\Psi_{a \to j}$ is the magnetic flux of all wires in bundle a through the surface of an elementary closed loop $S_j$ of bundle b formed between the signal-wire segment of bundle b and respective return-path segments j. For example, FIG. 2 is a block diagram 200 illustrating the magnetic flux 210 of a first exemplary bundle 202 (bundle a in the equations) through the surface 212 of the closed loop $S_j$ of a second exemplary bundle 204 (bundle b in the equations). In Equation (17), the fact that the loops in the second bundle 204 are not really closed (they are missing the perpendicular segments at the ends) can be ignored in certain embodiments because the error introduced by the absence of the segments is small so long as the transverse dimensions (the lengths of the missing segments) are small compared to the length of the bundle and the separation between the bundles.

The fluxes can be computed using Stokes' theorem as follows:

$$\Psi_{a \to j} = \int\!\!\int_{S_j} (\nabla \times A^{(a)}) \cdot dS_j = \oint_{\partial S_j} A^{(a)} \cdot dl_j, \tag{18}$$

where $A^{(a)}$ is the vector potential due to all wires in bundle a, and $\partial S_j$ is the boundary of the surface of the closed loop $S_j$.

To split the closed curvilinear integral in Equation (18) into two rectilinear integrals (one over the signal wire, the other over the return path j), the contribution from the last integral should be multiplied by -1 because the closed integral is circulated in one definite sense. Summing up all the terms, expression (18) becomes:

$$W_{ab} = \frac{I_b}{2} \sum_{j \geq 0} \alpha'_{b,j} \int_{C_j} A^{(a)} \cdot dl_j, \tag{19}$$

where $C_j$ is the conductor $j \geq 0$, and $\alpha'_{b,j} = \alpha_{b,j} \forall j \geq 1$.

As explained below, a technique utilizing magnetic dipole calculations can be used to efficiently calculate the interaction between the two bundles. For example, in certain embodiments of the disclosed technology, the field due to all the current loops in bundle a can be considered as the one generated by a representative dipole moment $p_a$. The mutual inductance between two bundles can then be found by calculating the magnetic flux due to the representative dipole moment of bundle a through surfaces in the bundle b formed between the respective signal-wire segment of bundle b and its corresponding ground-wire segments, and performing a weighted average of the individual contributions of all such surfaces in bundle b.

Figure 3A:
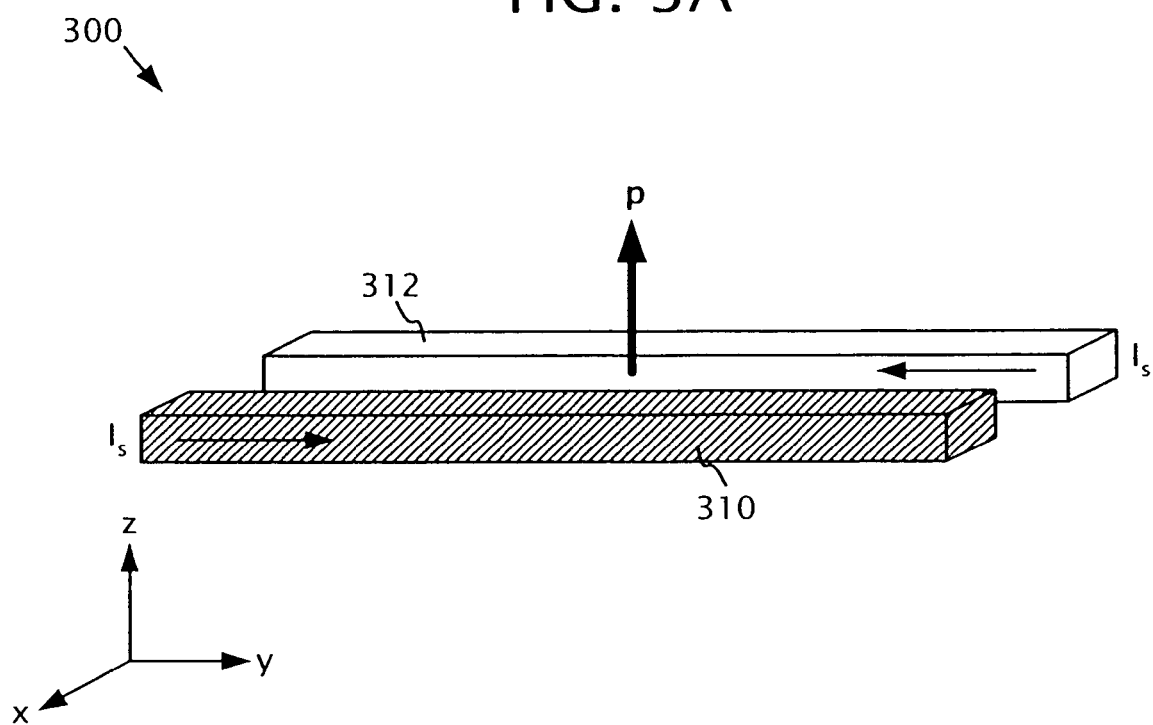
FIGS. 3A and 3B are block diagrams illustrating an exemplary bundle comprising a signal wire and a single associated ground wire.
Figure 3B:
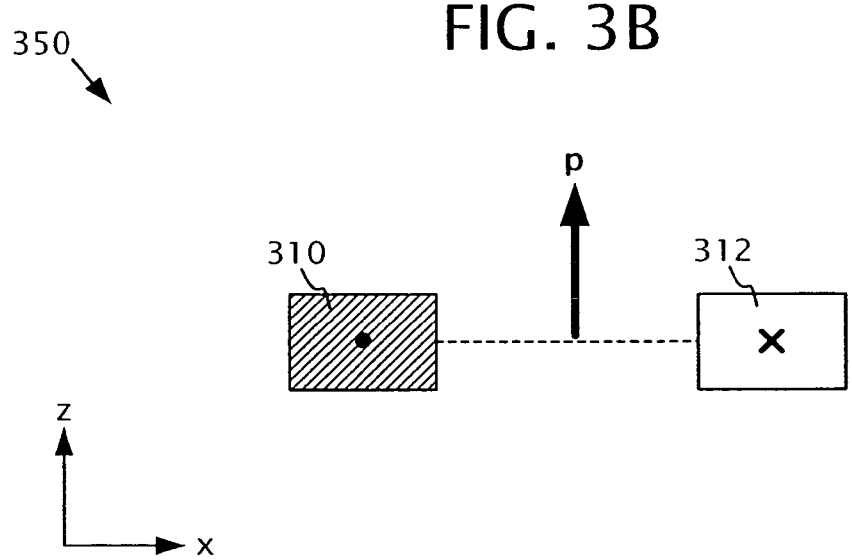

To compute the value of $p_a$, consider the dipole of an exemplary bundle configuration as shown in FIG. 3A. FIG. 3A is a block diagram 300 showing a perspective view of a signal-wire segment 310 that is parallel to a return-path segment 312 with segments 310, 312 both lying in a common x-y plane. FIG. 3B is a block diagram 350 showing a cross-sectional view of the configuration shown in FIG. 3A. In this simple case:

$$p_a = \frac{\mu_0}{8\pi} \int r \times J(r) d^3r \qquad (20)$$
$$= \frac{\mu_0}{8\pi} ILs\hat{z},$$

where L is the common length of the two wires 310, 312, and s is the separation between them (note that $p_a$ is proportional to the area spanned by the circuit and points in the direction $\hat{z}$ normal to the plane containing them).

Figure 4A:
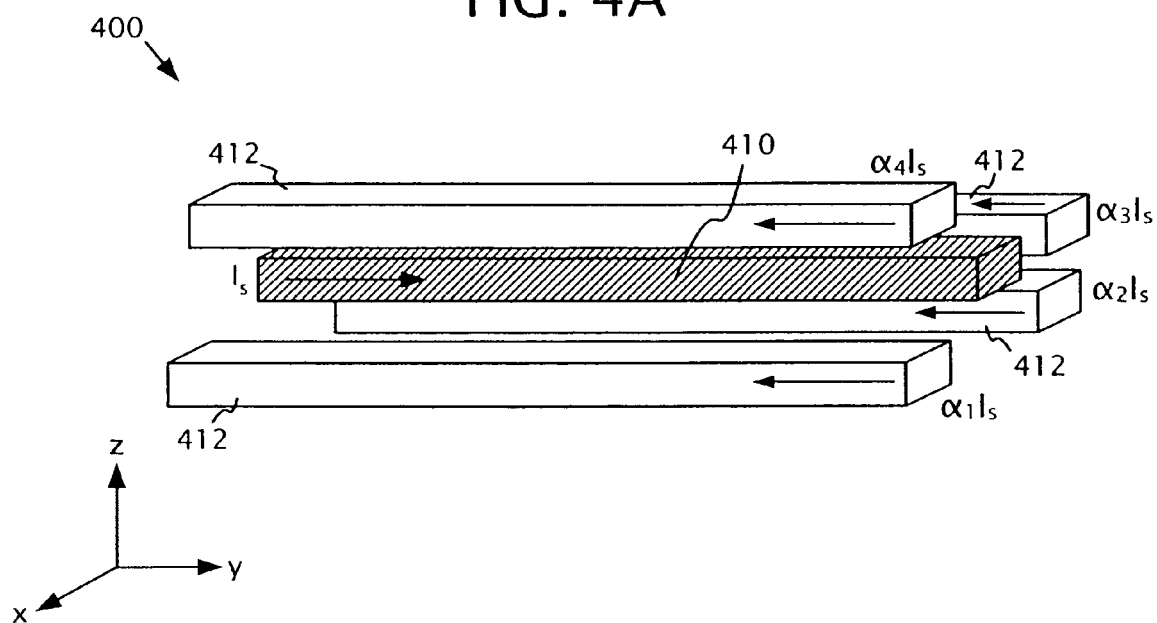
FIGS. 4A and 4B are block diagrams illustrating an exemplary bundle comprising a signal wire and multiple associated ground wires.
Figure 4B:
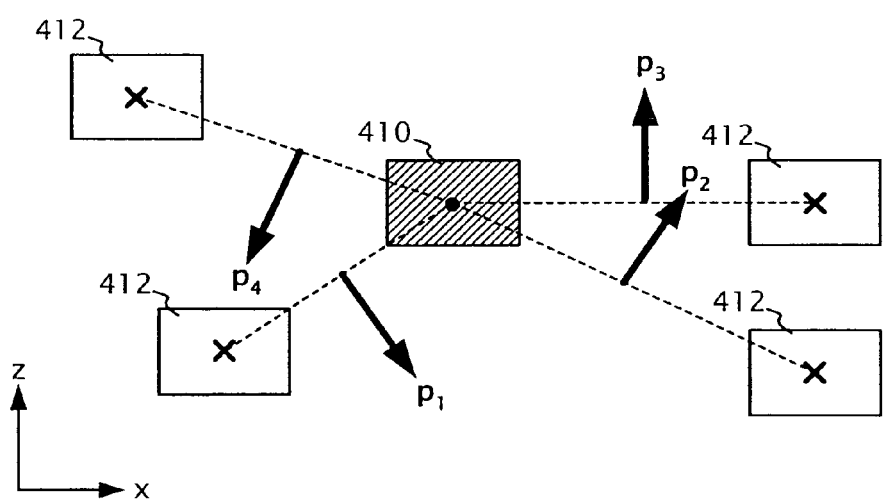

An example of the case where bundles have multiple return paths is shown in FIGS. 4A-B. FIG. 4A is a block diagram 400 showing a perspective view of a signal wire 410 having return paths along four neighboring wires 412 (labeled "$\alpha_1 I_s$," "$\alpha_2 I_s$," "$\alpha_3 I_s$," and "$\alpha_4 I_s$," respectively). FIG. 4B is a block diagram 450 showing a cross-sectional view of the configuration shown in FIG. 4A. For bundles having multiple return paths (here, oriented along the y axis), the integral in the first line of Equation (20) can be decomposed into several terms like the one in the second line of the equation. Because each of those terms is proportional to the current it carries, the terms can be weighed by geometrical coefficients $\alpha_i$, iea as in Equation (17). The expression for the magnetic dipole moment in this case becomes:

$$p_a = \frac{\mu_0}{8\pi} I_a \sum_{i \geq 0} \alpha_{a,i} (\hat{y} \times r_i), \qquad (21)$$

where $r_i$ is the position of the return path i with respect to the signal wire and a identifies the bundle.

Because the total current in a bundle adds up to zero, the value obtained by equation (21) is independent of where the origin of coordinates is located. In one exemplary embodiment of the disclosed technology, the origin is chosen as the position of the "center of mass" of bundle a. Specifically, the center-of-mass position $r_{cm,a}$ can be found as follows:

$$r_{cm,a} = \frac{1}{2} \sum_{i \geq 1} \alpha_{a,i} r_i. \qquad (22)$$

Thus, according to Equation (22), the center-of-mass position is the weighted average of the position of all the constituent dipole moments of the form shown in Equation (20) above.

The expression for the vector potential A at position r due to a dipole Pa at this respective origin is:

$$A^{(a)} = \frac{p_a \times r}{r^3}. \qquad (23)$$

The $1/r^2$ behavior of A corresponds to the $1/r^3$ behavior for B indicated by Equation (11).

By inserting Equation (23) into Equation (19), an expression can be obtained which provides a closed expression of the mutual inductance ($M_{ab}$) between bundles a and b using the representative dipole $p_a$:

$$M_{ab} = \frac{1}{I_a} \sum_{j \geq 0} \alpha'_{b,j} \int_{C_j} \frac{(p_a \times r_j)}{r_j^3} \cdot dl_j. \qquad (24)$$

In general, the resulting inductance matrix M is complex, with the real part of Equation (24) contributing to the mutual inductance. The imaginary part of M modifies the resistance, and is effectively negligible in all the examples presented herein.

Inspection of Equations (21) and (24) shows that dipole moment $p_a$ is proportional to $I_a$; hence, $M_{ab}$ does not depend on the currents, but is instead a geometric coefficient. For the ease of presentation, the term $p_a/I_n$ is hereafter denoted: $\tilde{p}_a$.

As noted above, conductors in a bundle typically run along the same direction (say $\hat{y}$); thus, $p_a$ is perpendicular to all the wires. According to one exemplary form, the $\hat{z}$ axis is chosen to be parallel to the dipole moment $p_a$. Equation (24) therefore becomes:

$$M_{ab} = \tilde{p}_a \sum_{j \geq 0} \alpha'_{b,j} x_j \int_{y_{0,j}}^{y_{1,j}} \frac{dy}{(x_j^2 + y_j^2 + z_j^2)^{3/2}}, \qquad (25)$$

where $y_{0,j}$ and $y_{1,j}$ are the extremes of conductors, in a coordinate system having an origin at $r_{cm,a}$. The expression in Equation (25) can be integrated as follows:

$$M_{ab} = \tilde{p}_a \sum_{j \geq 0} \frac{\alpha'_{b,j} x_j y_j}{(x_j^2 + z_j^2)(x_j^2 + y_j^2 + z_j^2)^{1/2}} \Bigg|_{y_j = y_{0,j}}^{y_j = y_{1,j}}. \qquad (26)$$

Thus, according to one exemplary embodiment, the mutual inductance between a first bundle (bundle a) and a second bundle (bundle b) can be performed by calculating the dipole moment and the position of the first bundle using Equations (21) and (22), then evaluating the expression (26) for each of the wires in the second bundle. An expression for the dipole moment $p_a$ for wires laid out along other axes (e.g., the x-axis) can similarly be constructed.

Note that Equation (24) does not strictly comply with the expected symmetry $M_{ab} = M_{ba}$. This results from the assumption that bundle a is an ideal point-like dipole, whereas this is not assumed for bundle b. As explained in the discussion accompanying the examples below, this asymmetry is rarely significant. In certain embodiments, the expected physical symmetry can be enforced by identifying M with $$\tilde{M}_{ab} = \frac{M_{ab} + M_{ba}}{2} \quad (27)$$

Comparison to Classical Equations

Figure 5A:
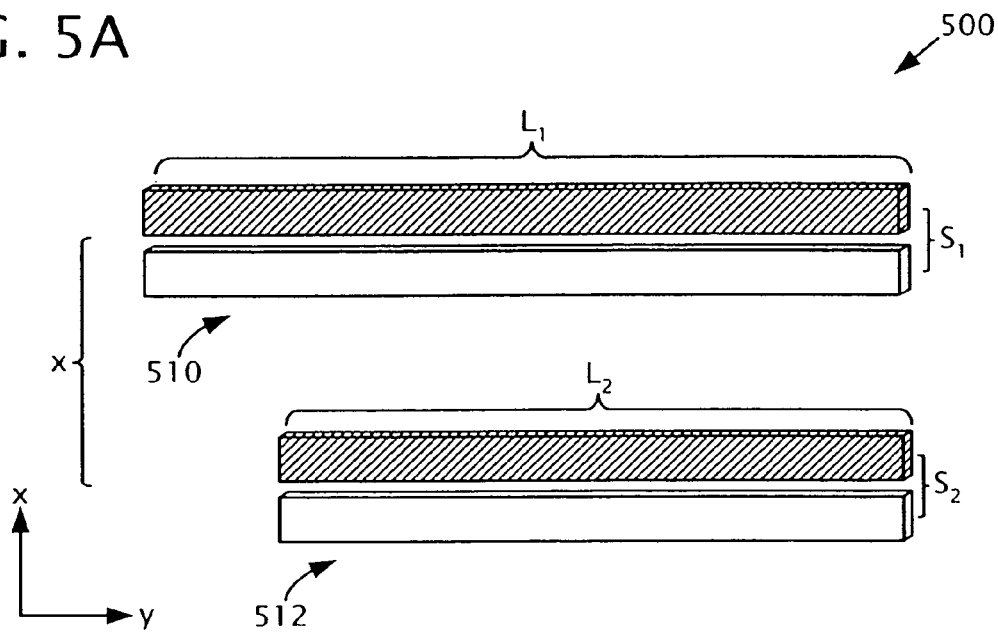
FIGS. 5A and 5B are block diagrams showing two bundles transversely coupled (FIG. 5A) and forward coupled (FIG. 5B).

To evaluate the disclosed mutual inductance extraction technique using dipole approximations, an embodiment of the disclosed technology is compared with the classic Grover expressions. The embodiment of the disclosed technology used in the comparison comprises calculating the dipole moment and the position of a first bundle using Equations (21) and (22), then evaluating Equation (26) for each of the wires in the second bundle. For purposes of this comparison, Equation (26) is used to replace the Grover equation for analyzing the combination of filament-to-filament interactions (see F. Grover, *Inductance Calculations Working Formula and Tables*, New York: Instrument Society of America (1945)). The classic Grover expression provides:

$$M_{ab} = \frac{\mu_0 L}{4\pi} \sum_{i \geq 0} \sum_{j \geq 0} \alpha_i \alpha_j M_{ij} \quad (28)$$

where $M_{ij} = \log\left(\frac{L}{r_{ij}} + \sqrt{1 + \frac{L^2}{r_{ij}^2}}\right) + \frac{r_{ij}}{L}\sqrt{1 + \frac{r_{ij}^2}{L^2}}$ To perform the comparison, consider the simple exemplary configuration shown in FIG. 5A, which illustrates two bundles that are transversely coupled. In particular, FIG. 5A is a block diagram 500 showing a first bundle 510 (or bundle a) separated by a distance x from a second bundle 512 (or bundle b). Further, the respective wires in each bundle are separated from each other by respective distances $s_1$ and $s_2$. The length of each bundle is $L_1$ and $L_2$, respectively. For the configuration shown in FIG. 5A, Equation (25) and Equation (26) give the same limit for x, $L \gg S_1, S_2$; namely, $$M_{ab} \simeq \frac{\mu_0}{4\pi} s_1 s_2 L_1 L_2 \frac{2x^2 + L_2^2/4}{x^2(x^2 + L_2^2)^{3/2}} \quad (29)$$

In the loop-inductance model, once all terms are accounted for, the asymptotic behavior of M is unlike that related to the partial-inductance model and stated in Equation (3). In fact, Equation (29) reveals two types of regimes for the transverse coupling shown in FIG. 5A:

$$M_{ab} \simeq \begin{cases} \frac{\mu_0}{2\pi} \frac{s^2 L^2}{x^3} \sim \frac{1}{r^3} & \text{for } x \gg L (3d \text{ case}) \\ \frac{\mu_0}{16\pi} \frac{s^2 L}{x^2} \sim \frac{1}{r^2} & \text{for } x \ll L (2d \text{ case}) \end{cases} \quad (30)$$

Figure 5B:
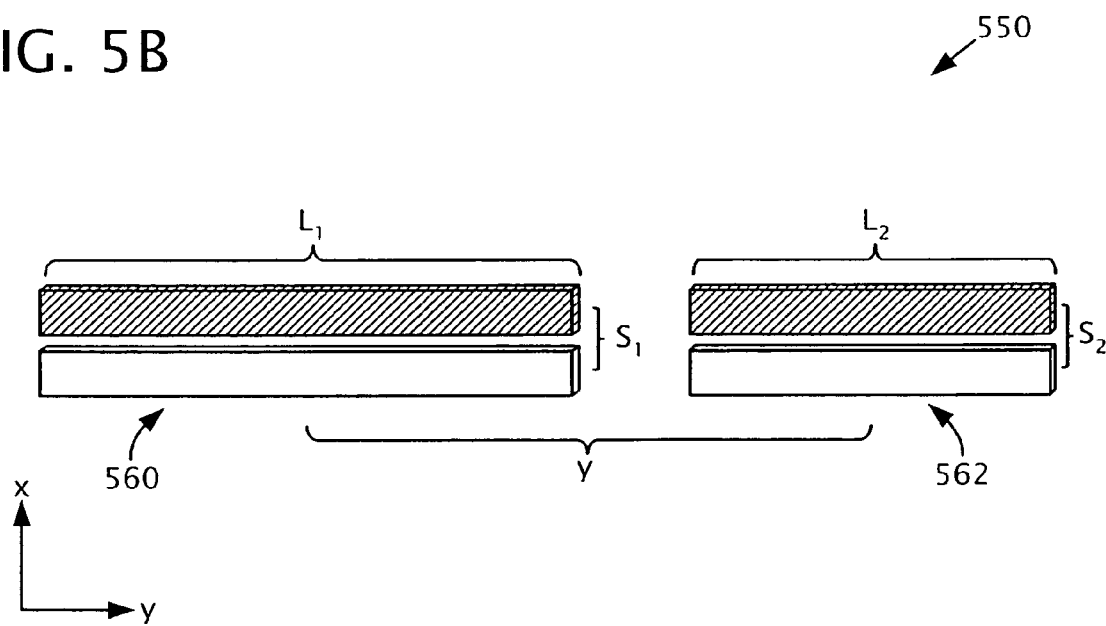

FIG. 5B illustrates two exemplary bundles 560, 562 coupled through forward coupling. In particular, FIG. 5B is a block diagram 550 showing a first bundle 560 (bundle a) having a center separated from the center of a second bundle 562 (bundle b) by a distance y along the y-axis. Further, the respective wires in each bundle are separated from each other by distances $s_1$ and $s_2$, and the length of each respective bundle is $L_1$ and $L_2$.

For the configuration illustrated in FIG. 5B, a comparison with the Grover expression, where $L_1, L_2, \Delta y \gg s_1 = s_2 \equiv s$, gives:

$$M_{ab}^{dipoles} \simeq \frac{16\mu_0}{\pi} \frac{s^2 L_1 L_2 \Delta_y}{(4\Delta_y^2 - L_2^2)^2}, \text{ and} \quad (31)$$

$$M_{ab}^{grover} \simeq \frac{16\mu_0}{\pi} \frac{s^2 L_1 L_2 \Delta_y}{(4\Delta_y^2 - L_1^2 - L_2^2)^2 - (2L_1 L_2)^2},$$

where both of the expressions have the same asymptotic behavior.

Exemplary Application of the Dipole Approximation on Inductors

Inductors (sometimes referred herein as "intentional inductors") are often used as components in high frequency RF (radio frequency) analog and mixed-signal integrated circuit and SOC design. See, e.g., Niknejad, Ali M., and Meyer, Robert G., "Simulation and Applications of Inductors and Transformers for Si RF ICs," (Kluwer Academic Publishers, 2000). It is not uncommon in RF applications to design ICs containing a fair number of inductors. Typically, each inductor occupies a substantial amount of space on the integrated circuit. Manufacturing yield generally favors layout configurations that minimize the distance among the different inductors on the integrated circuit, while circuit considerations favor symmetrical configurations.

The mutual inductance between two intentional inductors is one parameter used for evaluating how close the user can place different inductors while still satisfying pre-specified noise limits. The inter-inductor noise can be determined by the mutual inductance and the mutual capacitance between the two inductors. The mutual capacitance between inductors falls rapidly with distance and can be computed using conventional techniques.

The mutual inductance between inductors in an IC (e.g., between two inductors on an IC) can be computed using Grover expressions, as described in Equation (28). Each term in the expression is given by the mutual partial inductance between two segments, one on each inductor. For two rectangular inductors, one consisting of N turns of four sides and the other consisting of M turns of four sides, the number of terms to be computed grows as 16×N×M, a rapidly growing quadratic expression. As explained below, the dipole approximation method can be applied directly to this computation. Further, for non-Manhattan inductors that have a higher inductance for a given area when compared to Manhattan inductors, the complexity of the calculation is N×M×(number of segments per turn in a first inductor (a))×(number of segments per turn in a second inductor (b).

According to one exemplary embodiment, the application of the dipole approximation technique to a first inductor (referred to herein as the "aggressor" or "inductor a") and a second inductor (referred to herein as the "victim" or "inductor b") proceeds as follows. Bundles can be formed respectively comprising two opposite segments in the same turn. Further, each constituent current loop may be represented by a closed polygon approximating the geometry of a turn. A loop consists of as many bundles as one half the number of segments per turn. In this situation, there is a single value of alpha ($\alpha$) that is equal to one. The dipole moment of the aggressor inductor is computed by adding the dipole moments of its constituent bundles. In one particular implementation, the dipole of an inductor is the sum of the dipole moments of each constituent loop in the inductor. The flux of the field generated by the single dipole of the aggressor inductor on each closed surface of the victim inductor is computed. For example, and as explained below with respect to process block 1606, equation (18) may be used. In applying equation

(18) the contributions of the wires perpendicular to the direction of the bundle are not neglected. In the case of a Manhattan layout, this results in a sum of terms like equation (26) for each segment oriented in the y direction, and an analogous term with y exchanged for x for segments oriented in the x direction.

This procedure can be more generally applied to non-Manhattan multiple turn inductors, where one simply needs to utilize the general expression (23) in the calculation of (18). The resulting expressions have the same complexity as equation (26). The resulting expressions may need to be symmetrized by interchanging victim and aggressor, and averaging the results to guarantee the symmetry property that $M_{ab}=M_{ba}$.

Specifically, in one particular embodiment, the resulting equation for the non-Manhattan case is:

$$M_{ab} = \vec{p}^a \sum_{j=1}^{N_b-1} \frac{c_j}{b_j^2 - a_j^2} \left( \frac{L_j + a_j}{(b_j^2 + a_j L_j + L_j^2)^{1/2}} - \frac{a_j}{b_j} \right) \quad (32)$$

where $L_j$ is the length of the j-th segment of inductor b, $z_b$ is the value of z for the whole inductor b and the following values are defined for each segment:

$$a_j \equiv \frac{1}{L_j}(x_{0,j}(x_{1,j} - x_{0,j}) + y_{0,j}(y_{1,j} - y_{0,j})) \quad (33)$$

$$b_j \equiv \sqrt{x_{0,j}^2 + y_{0,j}^2 + z_b^2}$$

$$c_j \equiv \frac{1}{L_j}(x_{0,j}(y_{1,j} - y_{0,j}) + x_{0,j}(y_{1,j} - y_{0,j})),$$

where $(x_{0,j}, y_{0,j})$ are the coordinates of the starting point of segment j and $(x_{0,j}, y_{0,j})$ are the coordinates of the ending point of segment j.

The complexity of the procedure can be estimated as follows. The total number of operations is given by $(N_a+N_b+2)$, with $N_a$=N×number of sides of the a polygon, and $N_b$=M× number of sides of the b polygon. The value of "2" that is added comes from the computation of the two dipole moments. The overall computation has been reduced from quadratic to linear complexity and each one of the terms involves ratios of polynomials including square roots. The above-described procedure and equations (32)-(33) are valid for any two inductors, either Manhattan or non-Manhattan.

Figure 16:
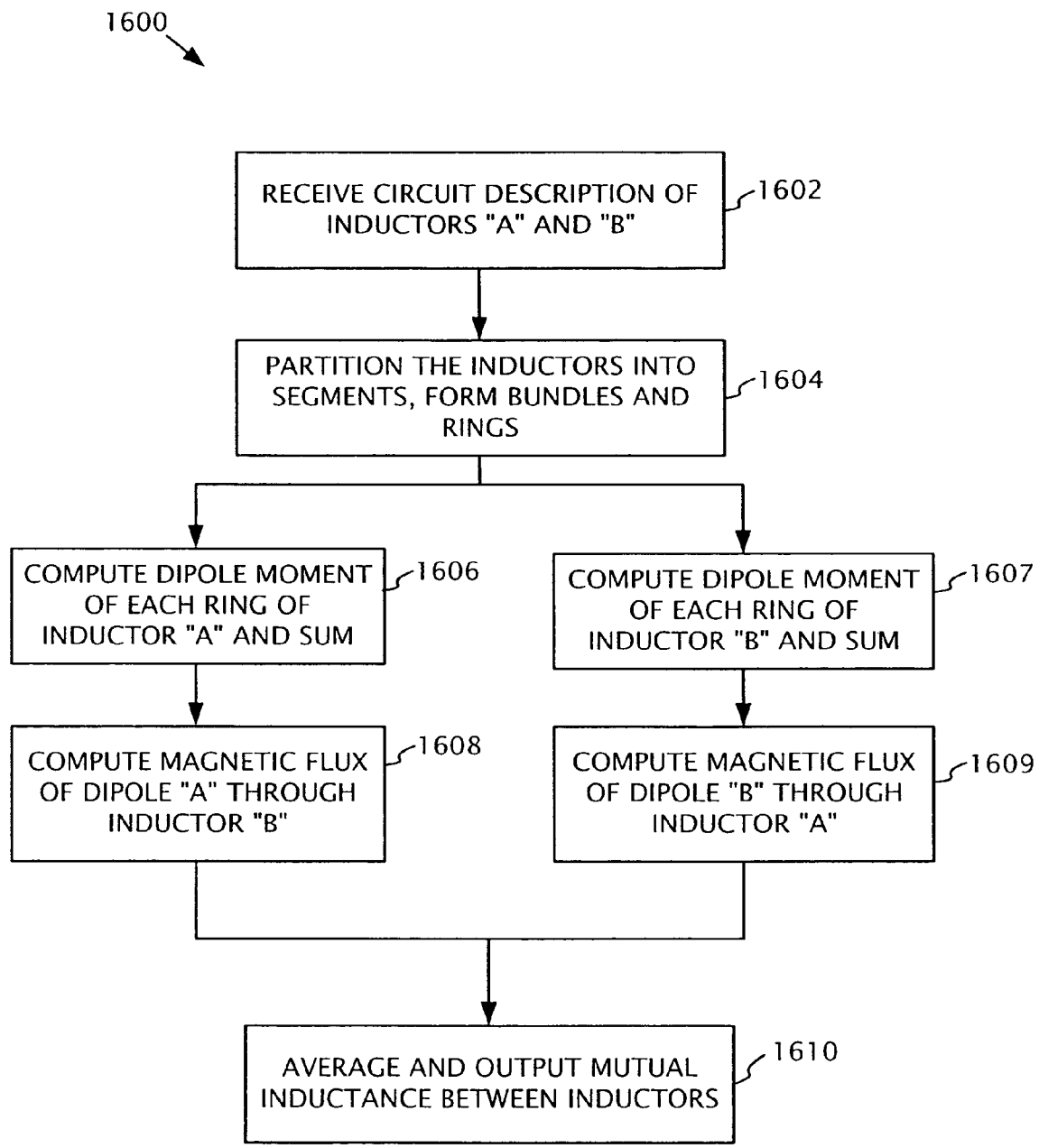
FIG. 16 is a flowchart showing an exemplary application of the dipole approximation on inductors.

To illustrate the above-described procedure, FIG. 16 is a flowchart showing one exemplary embodiment of a method 1600 for computing mutual inductance between two rectangular inductors using the dipole approximation technique. In particular, the flowchart shows the mutual inductance computation between inductor a and inductor b, which are not necessarily equal. FIG. 17 is a block diagram 1700 schematically showing inductor a and inductor b.

At process block 1602, a circuit description of a circuit is received (e.g., a circuit design file, such as a GDSII or Oasis file containing the intentional inductors). The circuit description may additionally comprise an indication of localization of the passive inductors.

Figure 18:
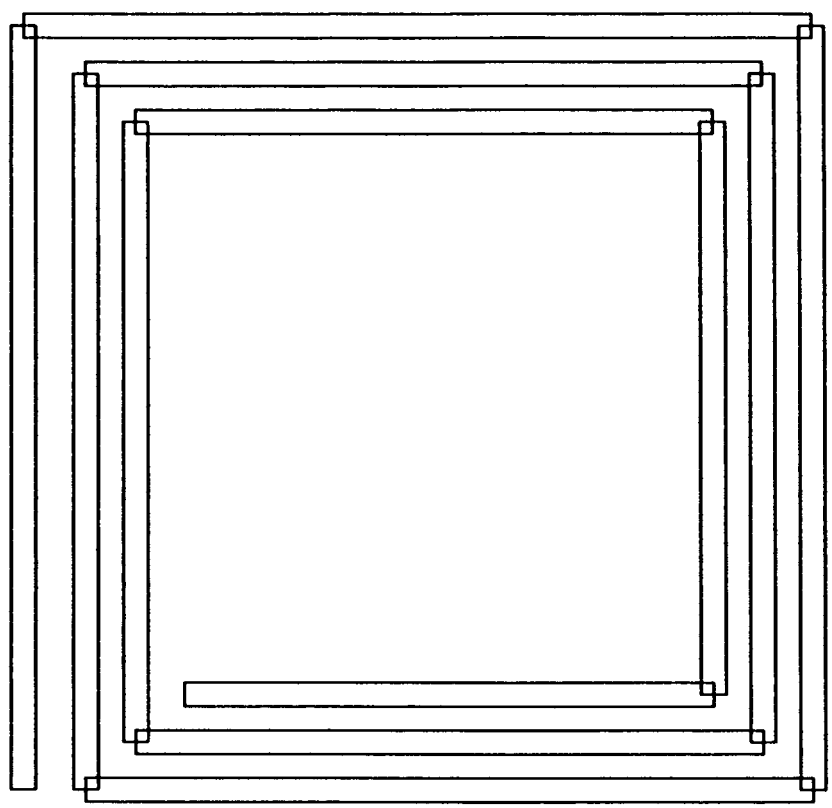
FIG. 18 is a block diagram showing an exemplary partitioning of an inductor into straight segments.

At process block 1604, the inductors are broken at their vertices in order to have straight segments. FIG. 18 is a block diagram 1800 illustrating this procedure for inductor a. Further, each turn in inductor a is replaced by a closed loop, or ring, in order to compute the dipole moment of the corresponding loop belonging to the inductor a. The loops or rings can be identified by closing the turns as illustrated in block diagram 1900 in FIG. 19. For purposes of this discussion, inductor a is considered to be the aggressor. As can be seen from FIG. 19, the approximate geometrical representation of inductor a is that of a concentric set of polygons (rectangles in the Manhattan case), one for each of the turns of the inductor. Bundles, as described above, can be formed from the rings.

At process block 1606, the dipole moments for each ring in inductor a are computed and summed. The resulting dipole moment of inductor a is proportional to the sum of areas of all its constituent polygons and can be computed in a single operation. This follows directly from equation (20).

At process block 1608, the mutual inductance is computed as the magnetic flux generated by inductor a though inductor b. This computation can be performed, for example, as described above for the case of bundles. In one particular implementation, equation (18) is applied. Specifically, to calculate the flux of the magnetic field due to the dipole moment of equation (36) through inductor b, equation (18) can be used as follows:

$$\Psi_{a \to j} = \oint_{\partial S_j} A^{(a)} \cdot dl_j \quad (37)$$

$$= \vec{p}^a \sum_{j=1}^{N_b} \int_{segment j} \frac{-y_j dx_j + x_j dy_j}{(x_j^2 + y_j^2 + z_j^2)^{3/2}}.$$

Integration of equation (37) leads to equation (32) above. In the Manhattan case, this results in a sum of terms like equation (26) for each segment oriented in the y direction, and an analogous term with y exchanged for x for segments oriented in the x direction. There are as many terms as there are segments in the victim. Further, the alphas ($\alpha$) can be replaced by "1", since all the current is carried by the loop.

The calculation can be repeated replacing inductor a with b, and averaging the two values obtained in this manner in order to arrive at a symmetrical mutual inductance between the two inductors. This is indicated in FIG. 16, for example, by the two branches in 1607, 1609 and subsequent merger at 1610, though it should be understood that this computation can be performed in some embodiments for just one inductor of the pair.

Figure 20:
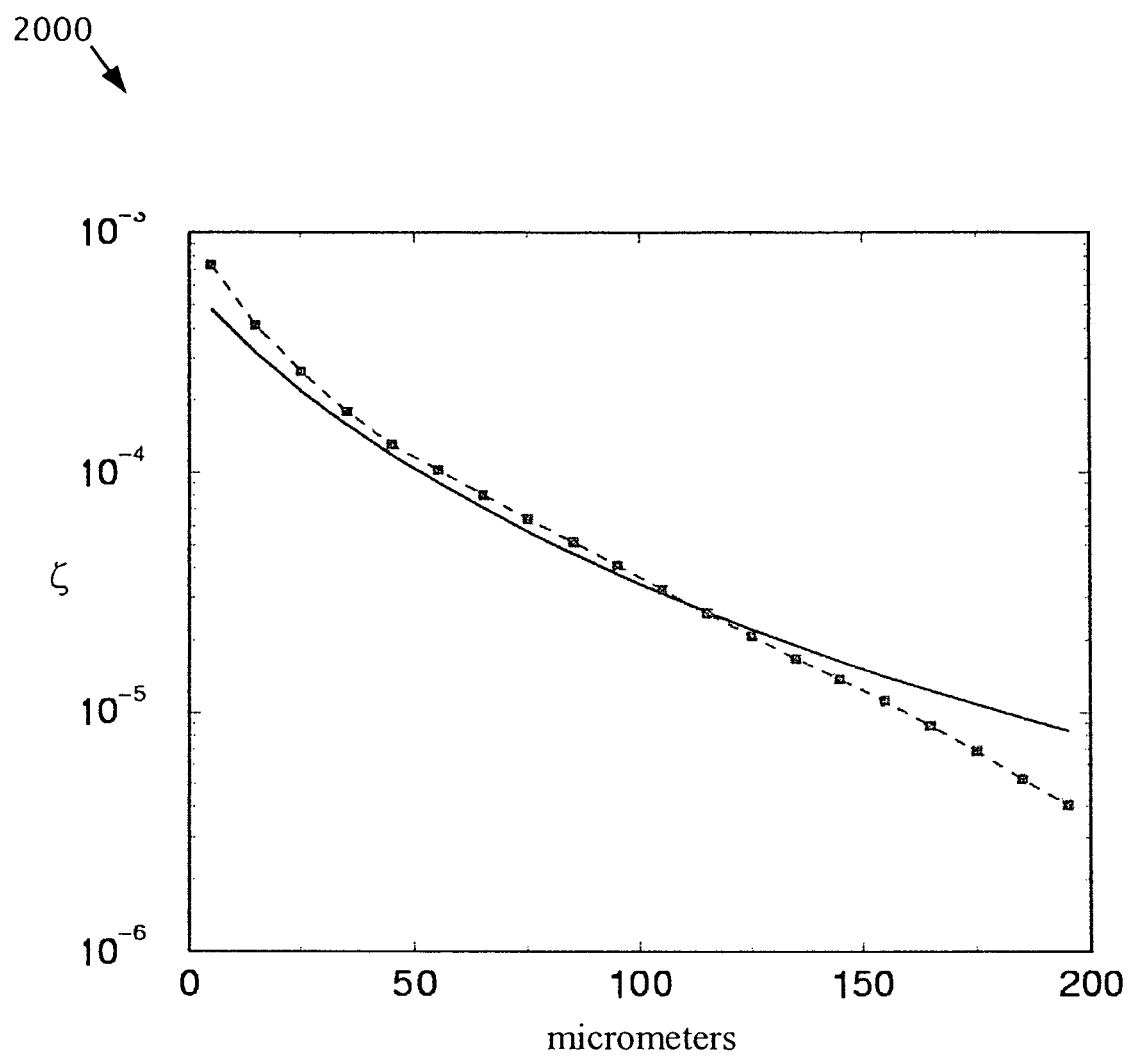
FIG. 20 is a graph showing a comparison between results of $\zeta$ as a function of two inductors' border-to-border separation obtained by an embodiment of the disclosed dipole approximation technique applied to a configuration having two inductors (dashed-symbol line).

FIG. 20 shows the result of a mutual inductance calculation between two exemplary rectangular inductors using the dipole approximation technique described above (dashed-symbol line) and a field solver (solid line). In graph 2000, the value of $\zeta \equiv M_{ab}/\sqrt{L_a L_b}$ (the ratio of the mutual inductance to the geometric average of the two self inductances) is plotted against the separation (in microns) between the borders of the two inductors. In this example, the first inductor has 5 turns and the second inductor has 6 turns. For both inductors, each turn consists of four segments, and the separation between turns is of 2 microns for the first inductor and 1 micron for the second. The wires of both inductors have a width of 1 micron and a thickness of 0.65 microns.

The Manhattan radius of one of them is 50 microns while the radius for the other one is 25 microns. Results for $\zeta$ show sufficiently good precision for noise estimations, where one is mainly interested in establishing bounds. Results for separations between the borders larger than 5 microns give adequate estimates for noise analysis. If the noise parameter $\zeta$ is larger than a predetermined noise figure of merit, one can increase the separation among the inductors until safe margins are satisfied. The process can be repeated for every pair of inductors till a desired configuration is obtained.

Figure 21:
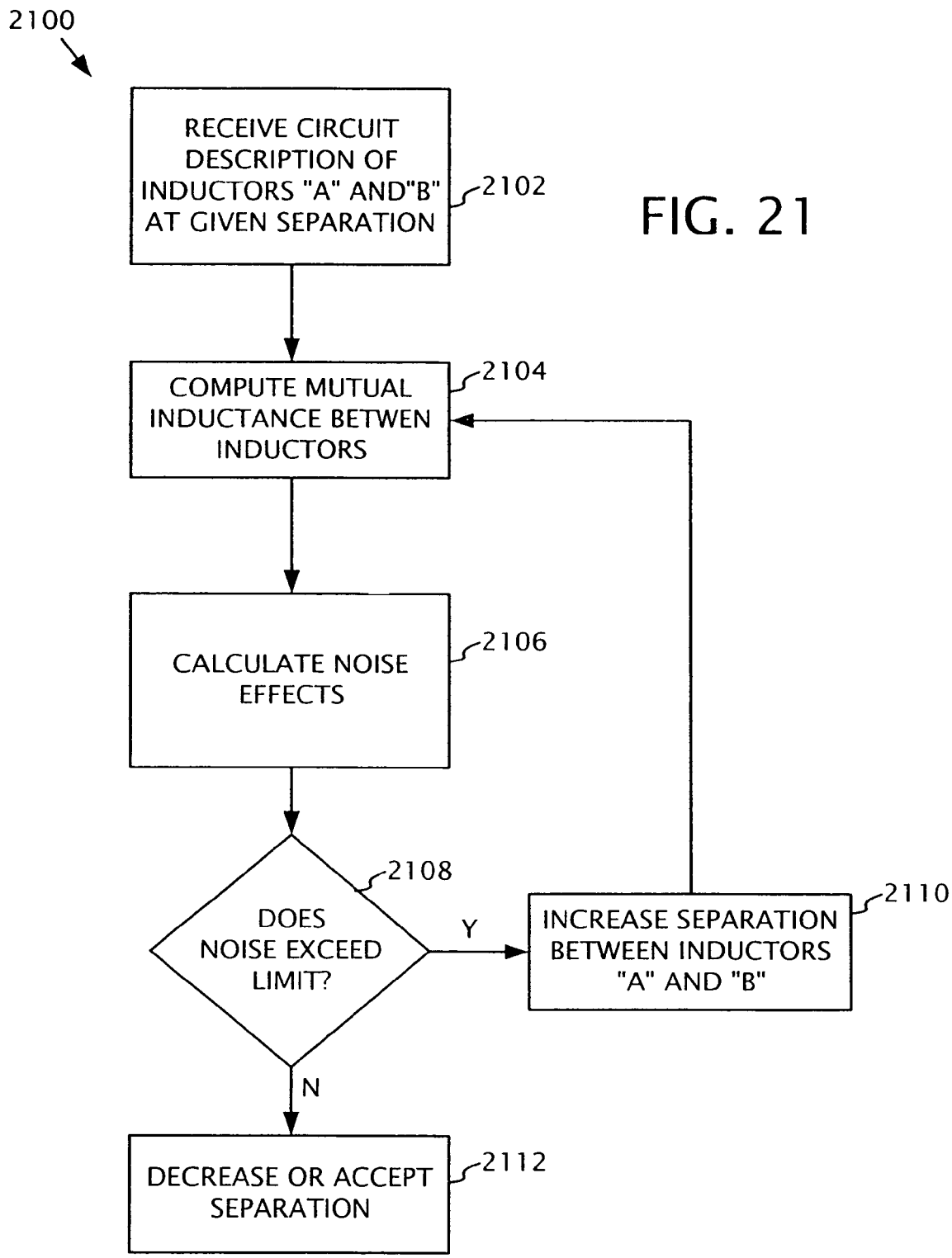
FIG. 21 is a flowchart of an exemplary method for evaluating and modifying the configuration of two intentional inductors using as parameters the prescribed noise limits, and varying the separations among inductors.

FIG. 21 is a flowchart of an exemplary method for evaluating and modifying the configuration of two intentional inductors using as parameters the prescribed noise limits. At process block 2102, a circuit description is received having a description of a first inductor (inductor a) and a second inductor (inductor b). At process block 2104, the mutual inductance between the inductors is calculated. For example, according to one embodiment, any of the implementation of method 1600 described above are used. At process block 2106, noise effects between the inductors are calculated. For instance, simulators (such as Eldo or Spice) can be used. At process block 2108, a determination is made as to whether the noise exceeds a noise limit (e.g., a user setting or value calculated to be a noise limit for the design being evaluated). If the noise exceeds the limit, then at process block 2110, the separation between inductors a and b is increased (e.g., by a fixed increment), and the procedure returns to process block 2104. If the noise does not exceed the limit, then the separation is accepted, or, in some implementations, decreased and tested again. In this manner, a minimum separation between inductors can be quickly and efficiently found while guaranteeing that the separation will not create impermissible noise in the circuit.

Applying the Disclosed Mutual Inductance Extraction Techniques

FIG. 6 is a flowchart of a general method 600 for analyzing the mutual inductance in a circuit layout using embodiments of the disclosed technology. The general method 600 may be used, for example, as part of an overall parasitic inductance extraction scheme. The method 600 can be performed, for example, in an EDA software tool, such as a physical verification tool. Because the general method 600 concerns mutual inductance, any corresponding self inductance calculations are not described, but it is to be understood that such calculations may be performed at least partially concurrent with or prior to the mutual inductance calculations. In certain embodiments, the method 600 is applied only for a layout operating above a certain selected frequency (e.g., frequencies above 1 GHz).

At process block 610, a circuit description is received (e.g., a circuit design file, such as a GDSII or Oasis file). The circuit description generally comprises data indicative of the physical layout of the signal wires, power wires, and ground wires in an integrated circuit.

At process block 612, the signal wires and grounds wires are grouped into bundles according to any of the techniques described above. In general, the ground-wire segments that are grouped into a bundle with a respective signal-wire segment correspond to the return paths for currents on the associated signal-wire segment. The selection of return paths for a particular signal-wire segment can be performed using a variety of different methodologies. According to one exemplary embodiment, for instance, neighboring wire segments are organized according to their resistance up to a maximum distance from the relevant signal-wire segment. In another embodiment, a weighted function of both resistance and distance is used. In other embodiments, however, other criteria may be considered. In certain implementations, only a portion of the layout is grouped into bundles (e.g., a portion selected by the user or a portion operating in a high-frequency clock regime).

At process block 614, dipole moments representative of one or more of the bundles are calculated. In one particular implementation, for example, dipole moments are computed according to Equation (21). The representative dipole moment of a particular bundle can comprise, for example, the weighted average of the individual dipole moments between the signal-wire segment in the bundle and each corresponding ground-wire segment in the bundle (as indicated in Equation (22), for instance). In certain embodiments, dipole calculations are made for every bundle formed at process block 612. In other embodiments, however, only a portion of the bundles have their associated magnetic dipole computed. For example, certain bundles may not have their associated magnetic dipole computed because of a user-defined criteria or because the bundles meet one or more criteria indicating that they exhibit little or no mutual inductance (e.g., using one or more of the dipole selection rules described below).

At process block 616, the mutual inductance between two or more of the bundles is calculated using the dipole moment(s). In certain exemplary embodiments, the mutual inductance calculation involves calculating the magnetic flux of a magnetic field due to one of the representative dipole moments through one or more closed surfaces between a distant signal wire and its neighboring ground wire. This calculation may be performed, for example, between the dipole moment of a first bundle and each ground-wire-segment/signal-wire-segment pair of a second bundle (e.g., the flux through all surfaces formed between the signal-wire segment of the second bundle and its associated ground-wire segments). These surfaces might comprise, for example, rectangular surfaces between a signal-wire segment and its associated ground-wire segments (e.g., as shown in FIG. 2). The respective contributions of each of these surfaces can be calculated as a weighted average. In one particular implementation, for example, the mutual inductance between two bundles is computed according to Equation (26). In certain implementations, mutual inductance between two bundles is calculated in this manner only if the distance between the bundles is greater than or equal to some threshold value (e.g., ~20 μm). Further, in certain embodiments, the magnetic flux of a first bundle's dipole moment through a second bundle is computed, as well as the magnetic flux of the second bundle's dipole moment through the first bundle. The resulting mutual inductances can be averaged to arrive at a single mutual inductance value for the pair of bundles.

Process blocks 614 and 616 (in their various embodiments) are sometimes collectively referred to herein as the "dipole approximation technique."

At process block 618, the calculated mutual inductance is output. The manner in which the mutual inductance is output may vary widely depending on the implementation and the environment in which the method is performed. For example, it may be displayed to the user (e.g., as part of a graphic user interface displaying at least a portion of the layout) or it may be included in one or more data structures or databases stored on computer-readable media. Such data structures and databases may be utilized later in an overall synthesis scheme.

Figure 7:
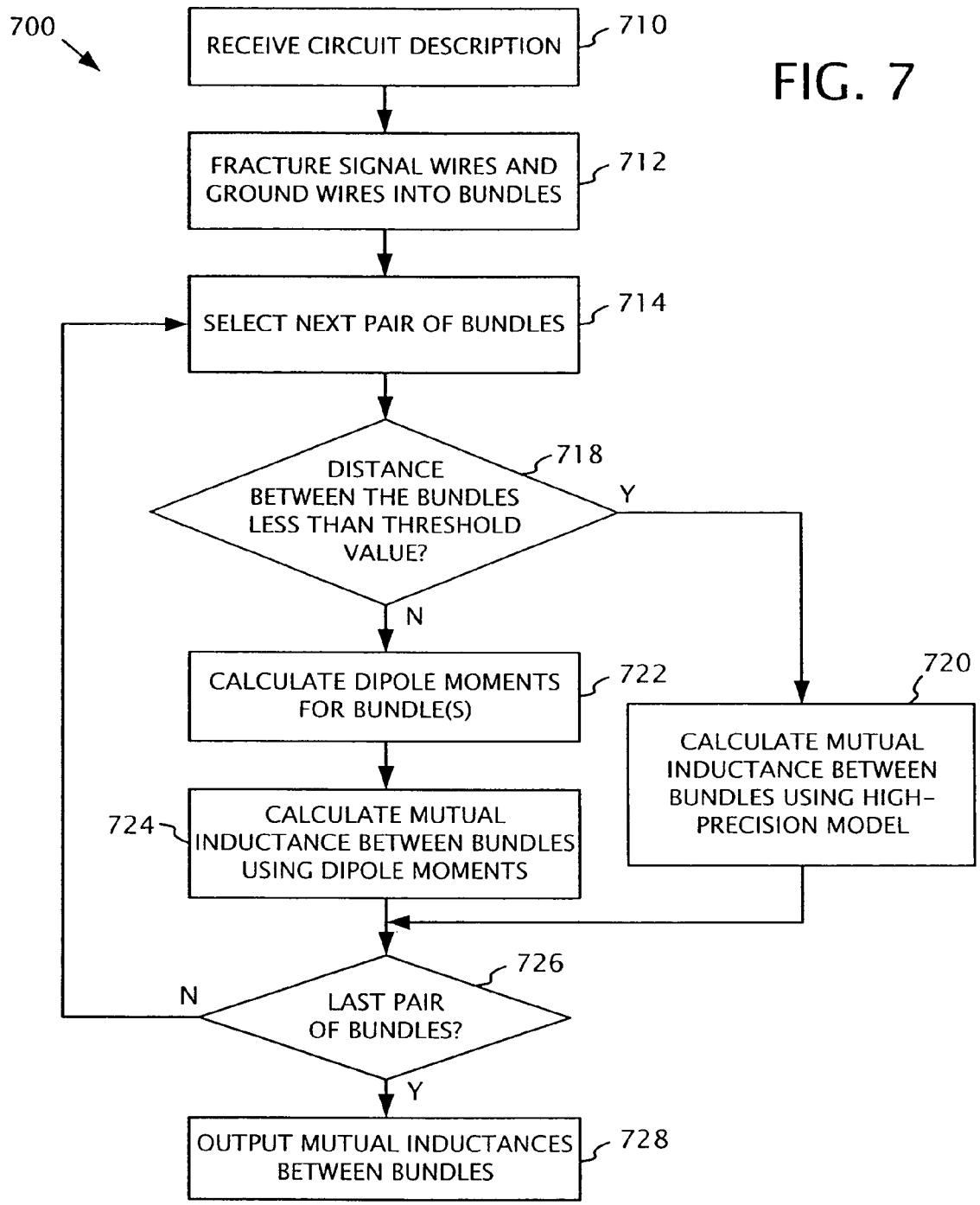
FIG. 7 is a flowchart of a more general exemplary method for analyzing mutual inductance utilizing an embodiment of the disclosed dipole approximation technique.

FIG. 7 is a flowchart of a more general exemplary scheme 700 for computing mutual inductance in a circuit design. As more fully explained below, the scheme 700 can utilize embodiments of the dipole approximation technique described above, as well as known partial-inductance models or mutual inductance calculations using Grover's equations or extensions thereof. In certain embodiments, for example, the dipole approximation technique is not used to analyze the interaction between degenerate bundles that share at least one return path. In these embodiments, the dipole approximation technique may still desirably be used to compute the coupling among different bundles separated by relatively large distances. In certain embodiments, the method 700 is desirably applied only for a layout operating above a certain selected frequency (e.g., frequencies above 1 GHz).

At process block 710, a circuit description is received. The circuit description typically comprises information concerning the physical layout of the signal wires, power wires, and ground wires in an integrated circuit. At process block 712, the signal wires and grounds wires are grouped into (or fractured into) bundles as explained above. At process block 714, a pair of bundles is selected for mutual-inductance analysis. This selection process may be performed in a variety of different ways (e.g., according to geometric location, size of the bundles, and/or other criteria).

At process block 718, a determination is made as to whether the distance between the bundles is less than a threshold value. In one exemplary embodiment, for example, this threshold value is equal to 20 µm. This value may vary, however, from implementation to implementation (e.g., 40 µm, 45 µm, or 50 µm) and may generally be viewed as the distance at which the possible error from the dipole approximation technique exceeds a desired limit. If the bundles are separated from one another by a distance that is greater than or equal to a threshold value, then an efficient (faster) mutual inductance extraction technique, which may not be precise at small distances, is desirably used. In the illustrated embodiment, for example, the dipole approximation technique described above is performed at process blocks 722, 724. (As described above in the discussion concerning degenerate configurations, however, there are instances when the dipole approximation technique may not be used because of the particular geometries of the bundle configurations.) Thus, the dipole moment for at least one of the bundles in the pair is calculated at process block 722 (e.g., using Equation (21)) and the mutual inductance between the bundles is calculated at process block 724 (e.g., using Equation (26)). In certain implementations, the efficient (faster) mutual inductance extraction technique is only used if the distance separating the bundles is within a certain range (e.g., 20-50 µm, or 20-100 µm). If the distance separating the bundles is beyond this range, no mutual inductance calculation is performed. Thus, a second threshold distance between bundles may exist, which, if exceeded, means that the mutual inductance between the bundles can be ignored.

If it is determined at process block 718 that the bundles are separated by a distance that is less than the threshold value, then the loop mutual inductances desirably are calculated using other means. In general, the mutual inductance calculation in this case is desirably performed by a technique that has greater precision at small distances than the technique used for the larger distances. The mutual inductance between the two bundles separated by less than the threshold distance (sometimes referred to as the "near-field solution") can be computed using the Grover equation shown in Equation (28) or an extended version thereof.

For example, in one specific implementation, the extension to Equation (28) may consist of averaging Equation (28) over the transverse dimensions of the participating wires. The end result can be obtained by substituting the values of $r_{ij}$ in Equation (28) with the geometric mean distance (GMD) among the respective cross-sections. The technique for calculating the GMD of two rectangular cross-sections described, for example, in R. Escovar and R. Suaya, "Transmission Line Design of Clock Trees," in *Proc. IEEE/ACM International Conference on CAD*, November 2002, pp. 334-340 and U.S. Patent Application Publication No. 2003/0131334, which is incorporated herein by reference, can be used. The resulting mutual inductance coefficients (using the values $\alpha_i$ computed using Equation (15)) and value obtained from Equation (28) (with the $r_{ij}$ reinterpreted as GMDs) agree well with results obtained from FastHenry. Moreover, the representative results shown in FIGS. 8-10 show that the analytical expressions derived from the dipole approximation technique converge to the near-field solution within distances of about 20 µm in the worst case. This scheme is consistent with the long-distance behavior, as the only modification to Equation (28) is the appearance of the partial self inductance, which replaces the partial mutual inductance between two ground wires. In certain embodiments, this scheme can be used for cases that have shared return paths that are not in a degenerate configuration. For cases that involve degenerate configurations, Grover-like expressions may be used.

At process block 726, a determination is made as to whether there are any more pairs of bundles to be considered. If so, then the method 700 returns to process block 714; otherwise, the mutual inductances between the bundles are output at process block 728. For example, as explained above, the mutual inductances may be displayed to the user or may be included in one or more data strictures or databases stored on computer-readable media.

It should be understood that the general methods 600 and 700 illustrated in FIGS. 6 and 7, respectively, comprise exemplary embodiments only and are not to be construed as limiting in any way. For example, the particular, sequential order shown in FIGS. 6 and 7 is not limiting, as the operations performed therein may, in certain implementations, be rearranged, performed concurrently, or not performed at all. For instance, in one exemplary embodiment, if the bundles are separated by a distance greater than or equal to the threshold value, no mutual inductance calculation is performed at all. Thus, only the high-precision calculation is used. Moreover, additional method acts may be interleaved within the methods 600 and 700. For example, according to one exemplary embodiment, after multiple bundles have been determined, one or more dipole selection rules (as explained below) may be applied to determine whether any particular bundles or pairs of bundles can be excluded from the mutual inductance calculation. Further, the operations performed in FIGS. 6 and 7 may be performed concurrently with other operations not directly related to the computation of mutual inductance (e.g., the analysis of self inductance or other physical parameters of the integrated circuit layout (such as, resistance, conductance, and signal integrity)).

Experimental Results and Exemplary Selection Rules for Applying the Disclosed Techniques In this section, the accuracy and application of the novel dipole approximation techniques are discussed in greater detail. To examine the accuracy of the disclosed technology, a comparison is made between the results obtained by Equation (26) and by the FastHenry field solver. FastHenry is an inductance extraction program that is publicly available from the Massachusetts Institute of Technology website. In general, FastHenry performs accurate detailed calculations of inductance for simple geometries, but is not suited for inductance extraction of large-scale topologies. In comparison to FastHenry, for example, the method of calculating mutual inductance using the dipole approximation is much more computationally efficient (faster).

The simulations in FastHenry were carried out assuming an operating frequency of 10 Ghz. To obtain good convergence with FastHenry, a 9×9 filament partitioning was used, though other partitioning may be accurate enough in some situations (e.g., 5×5 partitioning). For purposes of these comparisons, all calculations using the dipole approximation technique used coefficients $\alpha_i$ based solely on resistance, as in Equation (14). A good criterion to be used in considering the errors introduced in a mutual inductance extraction method is the comparison to the (typically larger) self inductances of the two bundles, $L_a$, $L_b$. For this reason, the comparisons are plotted using the dimensionless magnitude $\zeta = M_{ab}/\sqrt{L_a L_b}$.

Figure 8A:
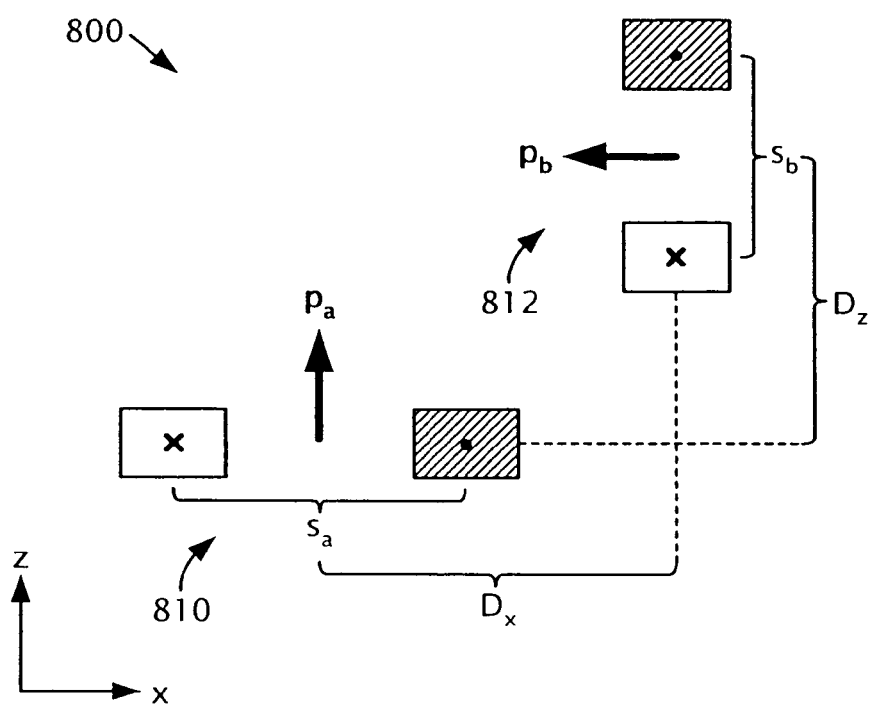
FIG. 8A is a block diagram showing two exemplary bundles having respective dipoles that are oriented perpendicular to one another.
Figure 8B:
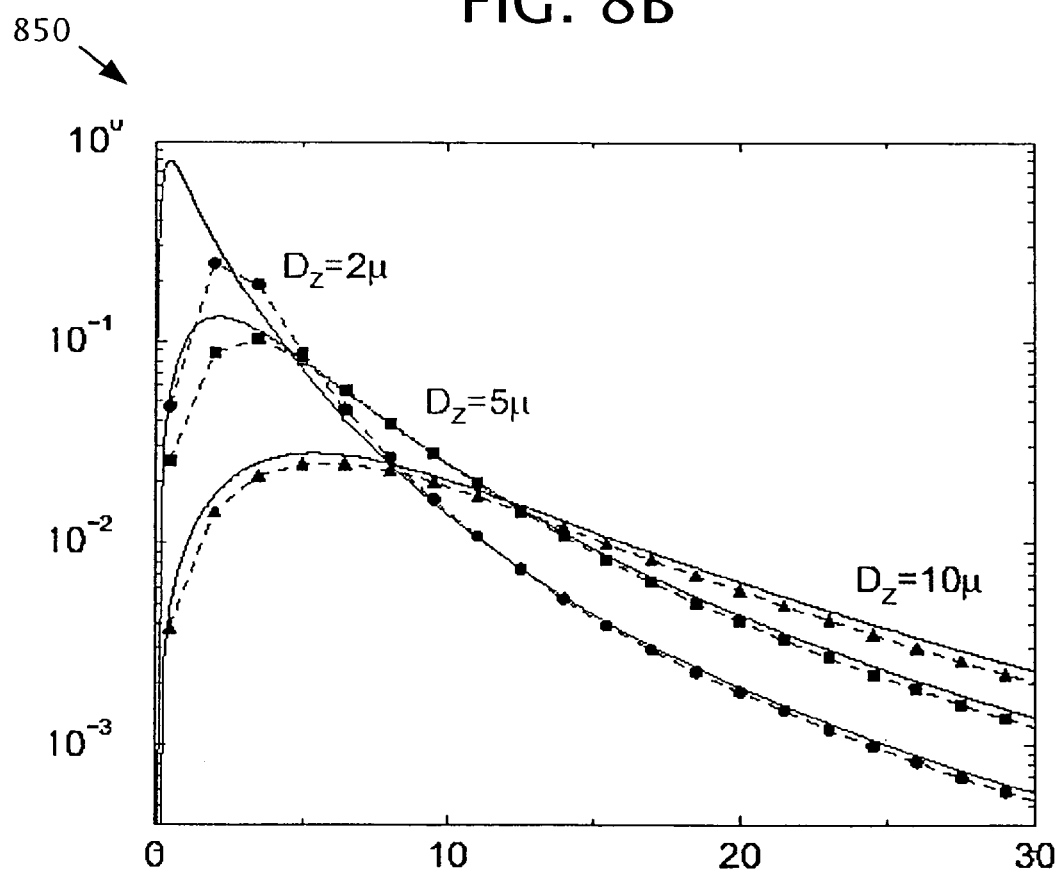
FIG. 8B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 8A.

FIGS. 8A and 8B show the first case considered: a simple coupling between two exemplary bundles positioned with respective dipole $p_a$ and $p_b$ that are perpendicular to one another. FIG. 8A is a block diagram 800 showing a cross-sectional view of the relative positioning of the bundles considered. In particular, FIG. 8A shows a first bundle 810 and a second bundle 812 separated from one another by a center-to-center distance $D_x$ along the x-axis and by a center-to-center distance $D_z$ along the z-axis. Bundles 810, 812 in this example each comprise a signal-wire segment and a ground-wire segment separated from one another by center-to-center distances $s_a$, $s_b$, respectively. Notice that in this example, the signal-wire segment and the ground-wire segment of one bundle are offset from each other in a first direction, and the signal-wire segment and ground-wire segment of the other bundle are offset from each other in a second direction. In this case, the first direction is perpendicular to the direction. In a specific example corresponding to FIG. 8A, the length of the wires (L) is 500 µm, the center-to-center separation between the wires in each bundle ($s_a$ and $s_b$, respectively) is 5 µm, the height of the wires (h) is 0.5 µm, and the width of the wires (w) is 0.5 µm.

FIG. 8B is a graph 850 showing a comparison between results obtained by an embodiment of the dipole approximation technique described above with respect to FIG. 6 using Equations (21) and (26) and results obtained from FastHenry for the configuration shown in FIG. 8A and for bundles having the specific exemplary dimensions and spacing mentioned above. In particular, graph 850 shows several plots for different values of $D_x$ as a function of $D_z$. The results obtained from FastHenry are shown in dashed lines with symbols, whereas the results obtained from the dipole approximation technique described above are shown in solid lines. As can be seen from FIG. 8B, the discrepancy between results obtained from FastHenry and the dipole approximation is relatively small (the difference has an upper bound of 10%).

Figure 9A:
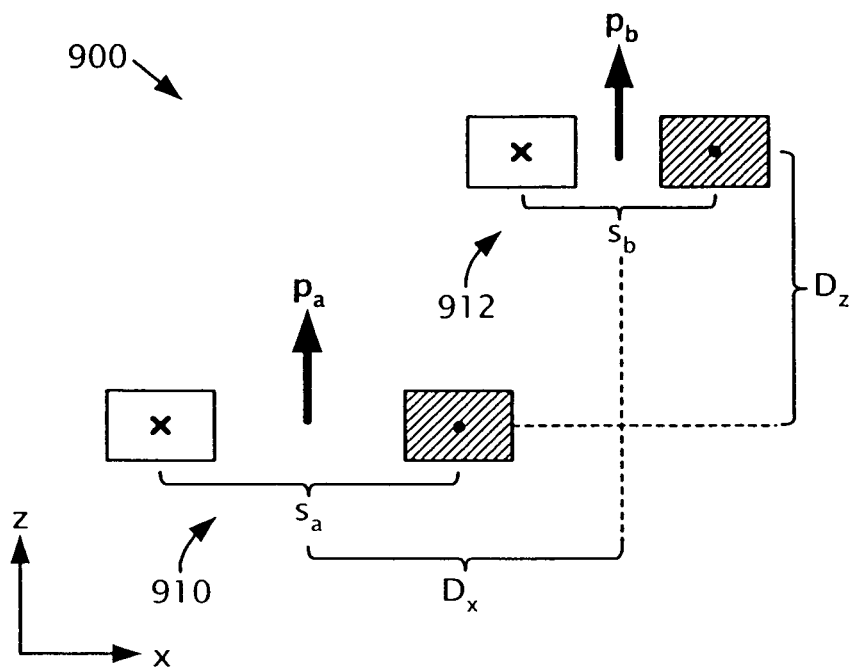
FIG. 9A is a block diagram showing two exemplary bundles having respective dipoles that are oriented parallel to one another.
Figure 9B:
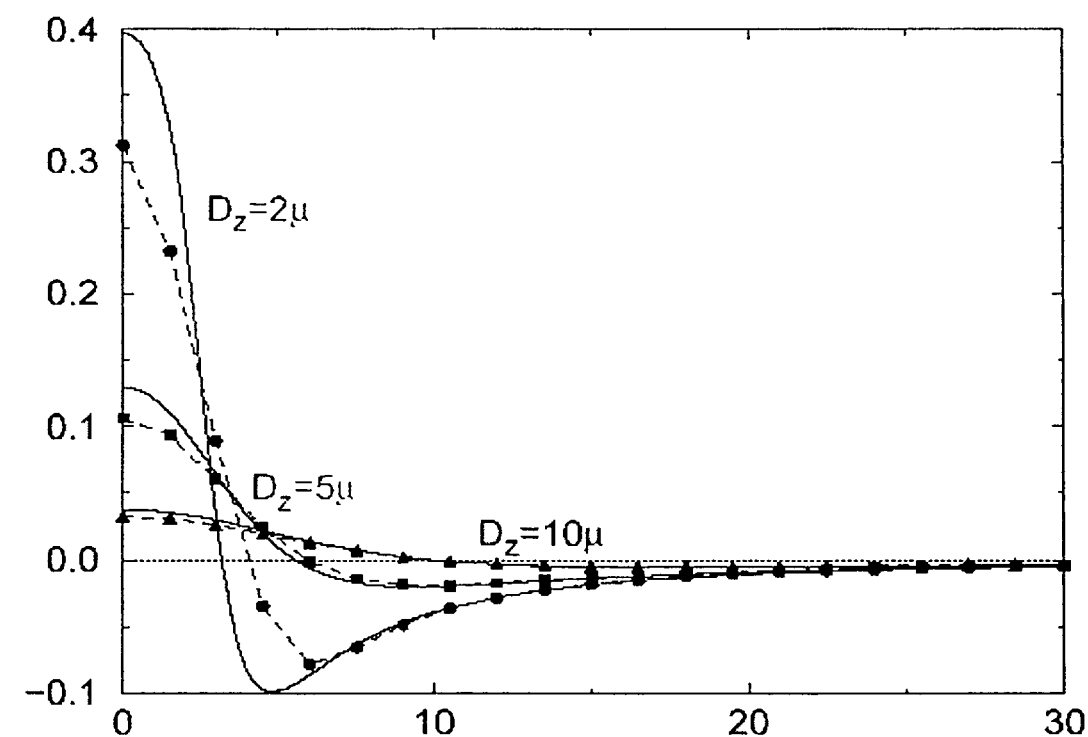
FIG. 9B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 9A.

FIGS. 9A and 9B show the second case considered: a coupling between two exemplary bundles (each having one respective return path) positioned with respective dipoles $p_a$ and $p_b$ that are parallel to one another. FIG. 9A is a block diagram 900 showing schematically the geometry considered. In particular, FIG. 9A is a cross-sectional view similar to FIG. 8A showing a first bundle 910 and a second bundle 912. In FIG. 9A, the signal-wire segment and ground-wire segment of one bundle are offset from one another in a first direction, and the signal-wire segment and ground-wire segment of the other bundle are offset from one another in a second direction that is parallel to and spaced from the first direction. In a specific example corresponding to FIG. 9A, the length of the wires (L) is 500 µm, the center-to-center separation between the wires in each bundle ($s_a$ and $s_b$, respectively) is 5 µm, the height of the wires (h) is 0.5 µm, and the width of the wires (w) is 0.5 µm.

FIG. 9B is a graph 950 showing a comparison between results obtained by an embodiment of the dipole approximation technique described above with respect to FIG. 6 using Equations (21) and (26) and results obtained from FastHenry for the configuration shown in FIG. 9A and for bundles having the specific exemplary dimensions and spacing mentioned above. In particular, graph 950 shows several plots for different values of $D_x$ as a function of $D_z$ with the results obtained from FastHenry shown in dashed lines with symbols and the results obtained from the dipole approximation technique shown in solid lines. Again, the discrepancy between the two techniques is very small and is upper bounded by 10%. It can be seen from FIGS. 8B and 9B that the dipole approximation technique works well for mutual inductances between bundles having single return paths, irrespective of the orientation of their dipole moments.

Figure 10A:
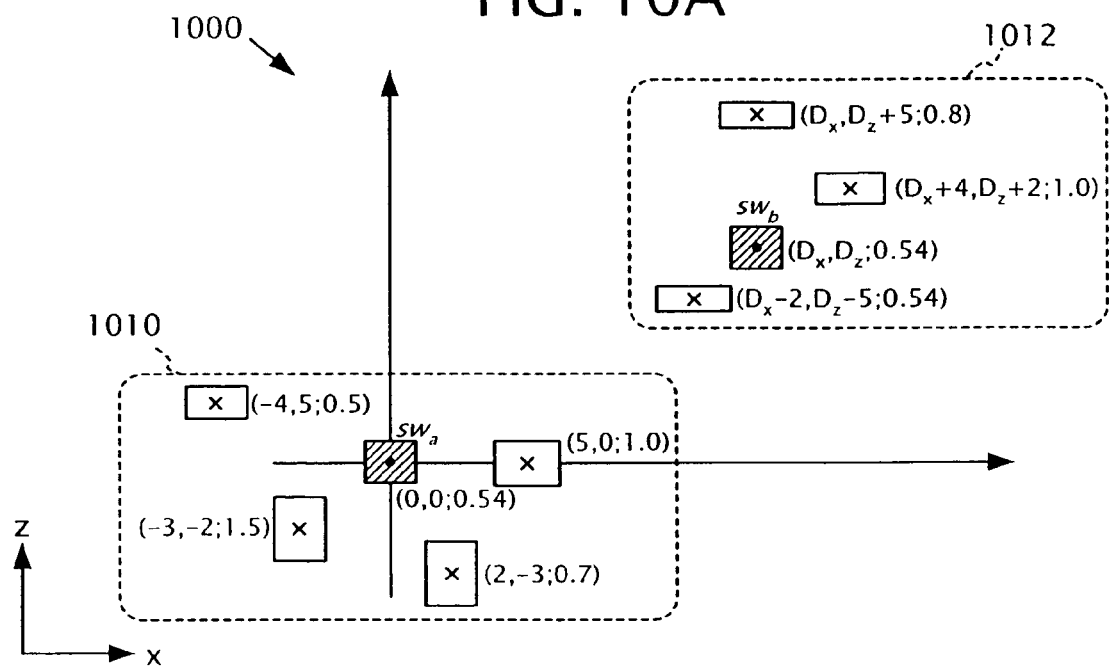
FIG. 10A is a block diagram showing two exemplary complex bundles having multiple return paths.
Figure 10B:
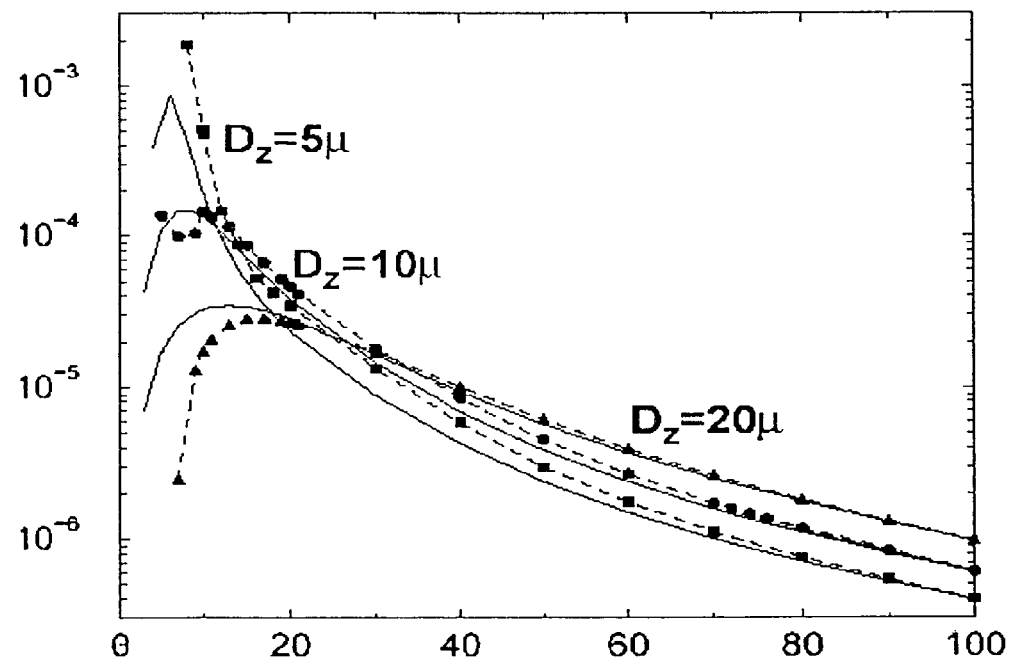
FIG. 10B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 10A.

FIGS. 10A and 10B show a slightly more complex geometry comprising two bundles, each having multiple return paths. In particular, FIG. 10A schematically shows a first bundle 1010 relative to a second bundle 1012. Each wire in the configuration is labeled with a respective triplet indicating the wire's x-axis position and z-axis position as measured from the center of the wire, and the wire's width. Further, the signal wires for each bundle are labeled $sw_a$ and $sw_b$, respectively. The ground wires for the signal wire $sw_b$ are labeled according to their relative position from the signal wire $sw_b$ (as measured in micrometers from the center of the ground wire to the center of the signal wire). For example, the ground wire labeled ("$D_x$–2, $D_z$–5; 0.8") has a center that is positioned 2 µm closer to the x-axis and 5 µm closer to the z-axis than the center of signal wire $sw_b$. Both of the bundles 1010, 1012 are asymmetric in terms of the widths of their return paths as well as their positions with respect to the signal wire. Each of the exemplary wires has a length (L) of 1000 µm and height (h) of 0.54 µm.

FIG. 10B is a graph 1050 showing a comparison between results obtained by an embodiment of the dipole approximation technique described above with respect to FIG. 6 using Equations (21) and (26) and results obtained from FastHenry for the specific exemplary configuration shown in FIG. 10A. In particular, graph 1050 shows several plots for different values of $D_x$ as a function of $D_z$ with the results obtained from FastHenry shown in dashed lines with various symbols (triangle, circles, or squares) along the respective plots, and the results obtained from the dipole approximation technique shown in solid lines. In this example, it can be seen that for the closest configurations (e.g., distances less than about 30 µm), there is a substantial difference between the two results. Even in those cases, however, the value of $\zeta$ is very small, thus rending these errors relatively insignificant when compared to the self inductances $L_a$, $L_b$.

From FIGS. 8-10, it can generally be observed that for arbitrary configurations, as long as the distance between bundles is not too small (e.g., 30 µm or larger), then the dipole approximation technique described above provides a good representation of the mutual inductance.

Experiments with the dipole approximation technique (such as the ones llustrated in FIGS. 8-10) have resulted in the development of a number of situation-dependent rules that can be used to determine when the mutual inductance between two bundles can be automatically neglected, thereby avoid unnecessary calculations. These rules are sometimes referred to as "selection rules" or "dipole selection rules."

A first rule is that for symmetric bundles, the mutual inductance is null. An exemplary wiring configuration that is symmetric is a sandwich configuration (comprising a symmetric coplanar ground-signal-ground bundle) as is used in many clock-signal layouts. Such a configuration has no dipole moment, meaning that in the dipole approximation technique, its signal voltage is insensitive to external noise. This rule was confirmed using FastHenry, wherein the mutual inductance between two of these structures was calculated and resulted in values of $\zeta$ below $10^{-5}$, even for bundles separated by as little as 5 µm. Thus, a determination can be made in any of the mutual inductance extraction techniques described herein as to whether the ground-wire segments are positioned symmetrically or substantially symmetrically (determined, for example, by a fixed or user-selected tolerance, e.g., ±5%) about a respective signal-wire segment. If so, the mutual inductance calculation for the signal wire can be foregone.

Figure 11A:
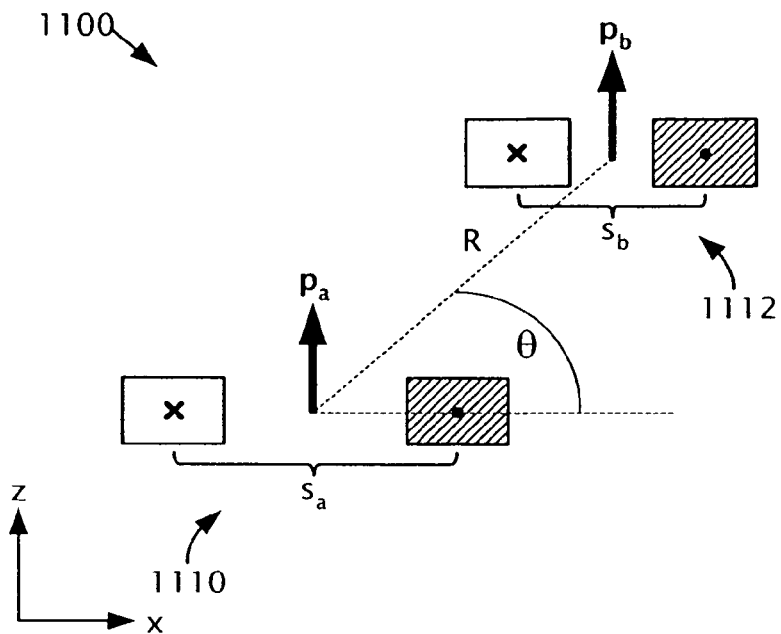
FIG. 11A is a block diagram showing two parallel bundles having a particular angular orientation from one another.

A second rule is that for two parallel bundles (such as those shown in FIG. 9A), the mutual inductance between them is minimized when their relative position to one another (measured from their center-of-mass positions (e.g., Equation (22)) forms a certain angle or substantially a certain angle (determined, for example, by a fixed or user-selected tolerance, e.g., ±5%) with the direction perpendicular to that of their common dipole moment directions (θ in FIG. 11A.) For example, this angle is about 45° when the bundles are much longer than their transverse dimensions and to about 35° when this is not the case. As with the first rule, the second rule can be utilized as part of any of the disclosed mutual extraction techniques. This second rule can also be used as a criterion by designers wishing to minimize the mutual inductance in a circuit layout.

The second rule can be verified by considering that the two bundles have aligned dipole moments. Thus, the flux of magnetic field through the second bundle due to the first one is proportional to the perpendicular field of the first one. Consequently, the angle where the perpendicular component for the field vanishes should be analyzed. In the situation where bundles are short, the perpendicular component ($B_\perp$) for the field of a dipole (found using the equation below) is null for $\theta = 0.5 \cos^{-1}(1/3) \approx 35°$. The perpendicular component ($B_\perp$) and the parallel component ($B_\parallel$) of the representative dipole can be found as follows:

$$B(r) = \frac{3(p \cdot \hat{r})\hat{r} - p}{r^3}, \quad (38)$$

$$B_\perp = \frac{1}{2}(3\cos 2\theta + 1)\frac{p}{r^3},$$

$$B_\parallel = \frac{3}{2}\sin 2\theta \frac{p}{r^3}.$$

Figure 11B:
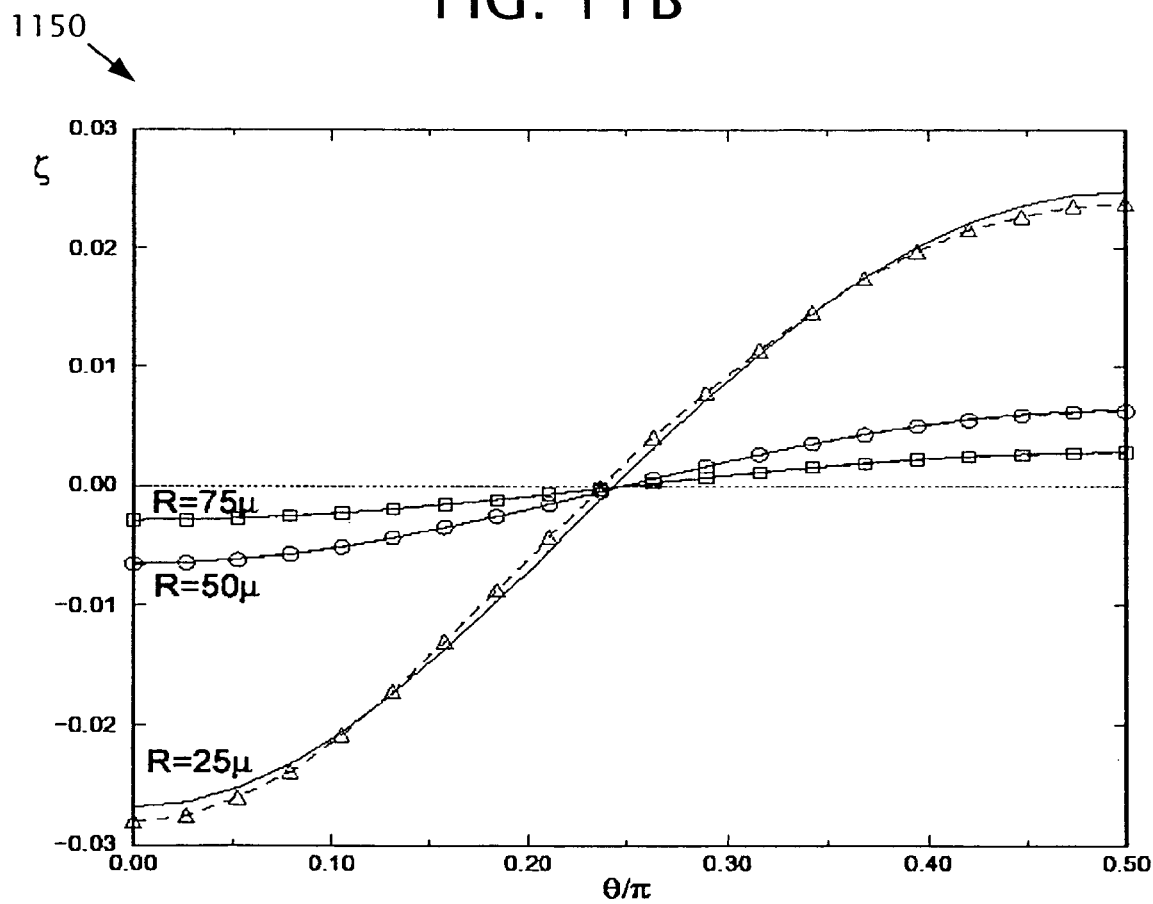
FIG. 11B is a graph showing a comparison between results obtained by an embodiment of the disclosed dipole approximation technique (solid lines) and results obtained from a field solver (dashed lines with symbols) for the configuration shown in FIG. 11B.

FIGS. 11A-B illustrate a numerical example of the second rule using the disclosed dipole approximation technique and FastHenry. In particular, FIG. 11A is a block diagram 1100 showing schematically an exemplary geometry of the type considered. FIG. 11A is a cross-sectional view similar to FIG. 9A showing a first bundle 1110 and a second bundle 1112. In FIG. 11A, the distance (R) between the respective center of the two bundles is assumed to be constant, whereas the angular orientation of the second bundle relative to the first (θ) is assumed to be variable. In FIG. 11A, the length of the wires (L) is 500 μm, the separation between the wires in each bundle ($s_a$ and $s_b$, respectively) is 5 μm, the height of the wires (h) is 0.1 μm, and the width of the wires (w) is 0.1 μm.

FIG. 11B is a graph 1150 showing a comparison between results obtained by using an embodiment of the dipole approximation technique described above with respect to FIG. 6 using Equations (21) and (26) and results obtained from FastHenry for the configuration shown in FIG. 11A and with the above dimensions. In particular, graph 1150 shows several plots for different values of R as a function of θ/π. In FIG. 11B, the results obtained from FastHenry are shown in dashed lines with symbols, and the results obtained from the dipole approximation technique are shown in solid lines. Note that a horizontal dashed line also appears in FIG. 11B and represents the point where ζ is null.

A third rule is that for two perpendicular or substantially perpendicular bundles (such as those shown in FIG. 8A), mutual inductance is negligible for situations where the perpendicular axis of one bundle passes through the center or substantially near the center (determined, for example, by a fixed or user-selected tolerance, e.g., ±5%) of the other. In one particular implementation, the center of the bundle comprises the center-of-mass position as determined by Equation (22). This third rule is a consequence of the fact that the parallel component ($B_\parallel$) of a dipole field vanishes when 0 is 0° and when 0 is 90°. This behavior can be observed in the configuration shown in FIG. 8A and the numerical results presented in FIG. 8B. In particular, this rule manifests itself in the results presented in FIG. 8B where the mutual inductance drops for small values of $D_z$ and where the magnitude of ζ decreases with decreasing $D_x$ for large values of $D_z$. As with the first and second rules, the third rule can be utilized as part of any of the disclosed mutual extraction techniques. The second and third rules can be particularly useful for pruning large layouts.

Efficiency Analysis of the Disclosed Dipole Approximation Technique

In order to analyze the efficiency of the disclosed dipole approximation technique, the runtimes for extracting mutual inductance using the dipole approximation technique and the runtimes for extracting mutual inductance using Grover's expression were compared. Grover's expressions give nearly the same results as FastHenry, meaning that the errors between the dipole approximation technique and Grover's expressions are as small as the errors discussed above with reference to FIGS. 8B, 9B, 10B, and 11B.

Assuming a simple, general configuration, with N wires broken up into $n_b$ bundles, Grover's expressions require $N^2/2$ computations of terms in the second line of Equation (28). On the other hand, the embodiment of the disclosed dipole approximation technique described above with reference to FIG. 6 and using Equations (21) and (26) requires a total of $Nn_b$ calculations. Thus, if there are usually multiple return paths per bundle in a layout (i.e., if $n_b \ll N/2$), then the dipole approximation technique involves a much smaller number of computations. Moreover, each computation of Grover's expression involves a transcendental function. By contrast, for the exemplary embodiment of the dipole approximation technique using Equations (21) and (26), there are N computations arising from the calculation of the dipole moment. This merely involves sums and multiplications plus $(n_b - 1)N$ computations (for the argument in the sum of Equation (26), where the most expensive (time consuming) operation is a half power).

Table 1 below presents a comparison between the two methods using an exemplary configuration involving two bundles having the same number of return paths. Runtimes are expressed in microseconds per mutual inductance computation. Approximately $10^8$ similar computations were averaged for each entry of the table. All runs were carried out on a desktop PC running at 2.0 GHz under identical situations.

TABLE 1

Comparative Runtimes Between an Embodiment of Dipole Approximation Technique and Grover's Expressions

| $N_{rp}$ | DA | GE | Ratio GE/DA |
|---|---|---|---|
| 1 | 0.412 | 1.586 | 3.85 |
| 2 | 0.544 | 3.343 | 6.14 |
| 3 | 0.697 | 5.817 | 8.34 |

TABLE 1-continued

Comparative Runtimes Between an Embodiment of Dipole
Approximation Technique and Grover's Expressions

| $N_{rp}$ | DA | GE | Ratio GE/DA |
|---|---|---|---|
| 4 | 0.784 | 9.052 | 11.54 |
| 5 | 1.000 | 13.002 | 13.00 |
| 6 | 1.092 | 17.902 | 16.39 |

The first column in Table 1 shows the number of return paths ($N_{rp}$) per bundle. The second column shows the runtime (in microseconds per computation) for an exemplary embodiment of the dipole approximation method (DA). The exemplary method utilized was the method discussed above with reference to FIG. 6 utilizing Equations (21) and (26). The third column shows the runtime using Grover's expression (GE). The fourth column shows the ratio between the runtime for Grover's expression and the exemplary dipole approximation technique (Ratio GE/DA).

As can be seen in Table 1, the runtime ratio (Ratio GE/DA) increases in an approximately linear fashion as the number of return paths in the bundles increases. This indicates that the exemplary embodiment of the dipole approximation technique is about an order of magnitude faster than using Grover's expression.

Exemplary Network Environments for Applying the Disclosed Techniques

Figure 12:
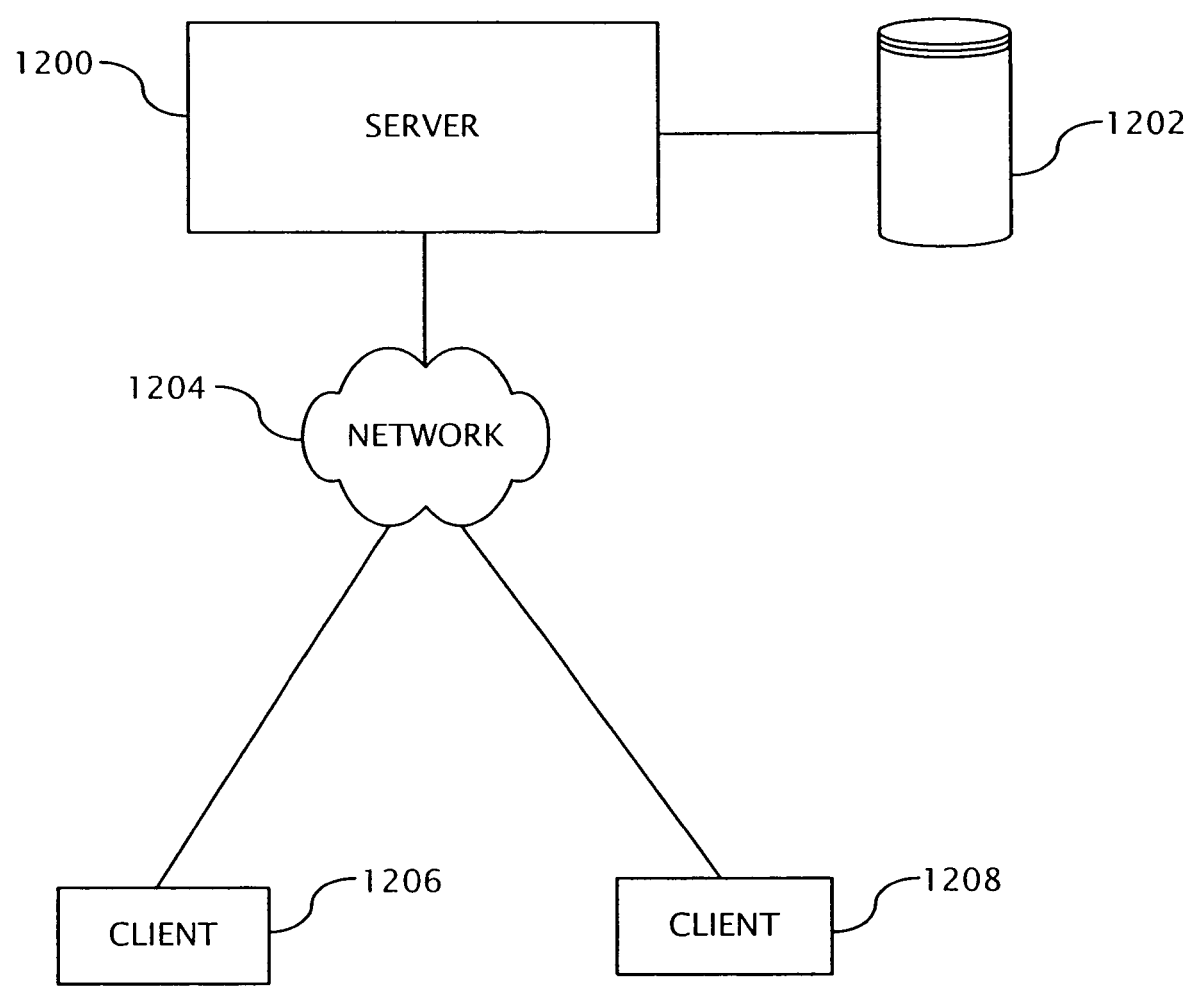
FIG. 12 is a block diagram of an exemplary network that may be used to perform any of the disclosed mutual inductance extraction techniques.

Any of the aspects of the technology described above may be performed using a distributed computer network. FIG. 12 shows one such exemplary network. A server computer 1200 can have an associated storage device 1202 (internal or external to the server computer). For example, the server computer 1200 can be configured to perform a mutual inductance extraction technique according to any of the disclosed embodiments (e.g., as part of an EDA software tool, such as a physical verification or synthesis tool). The server computer 1200 may be coupled to a network, shown generally at 1204, which can comprise, for example, a wide-area network, a local-area network, a client-server network, the Internet, or other such network. One or more client computers, such as those shown at 1206, 1208, may be coupled to the network 1204 using a network protocol.

Figure 13:
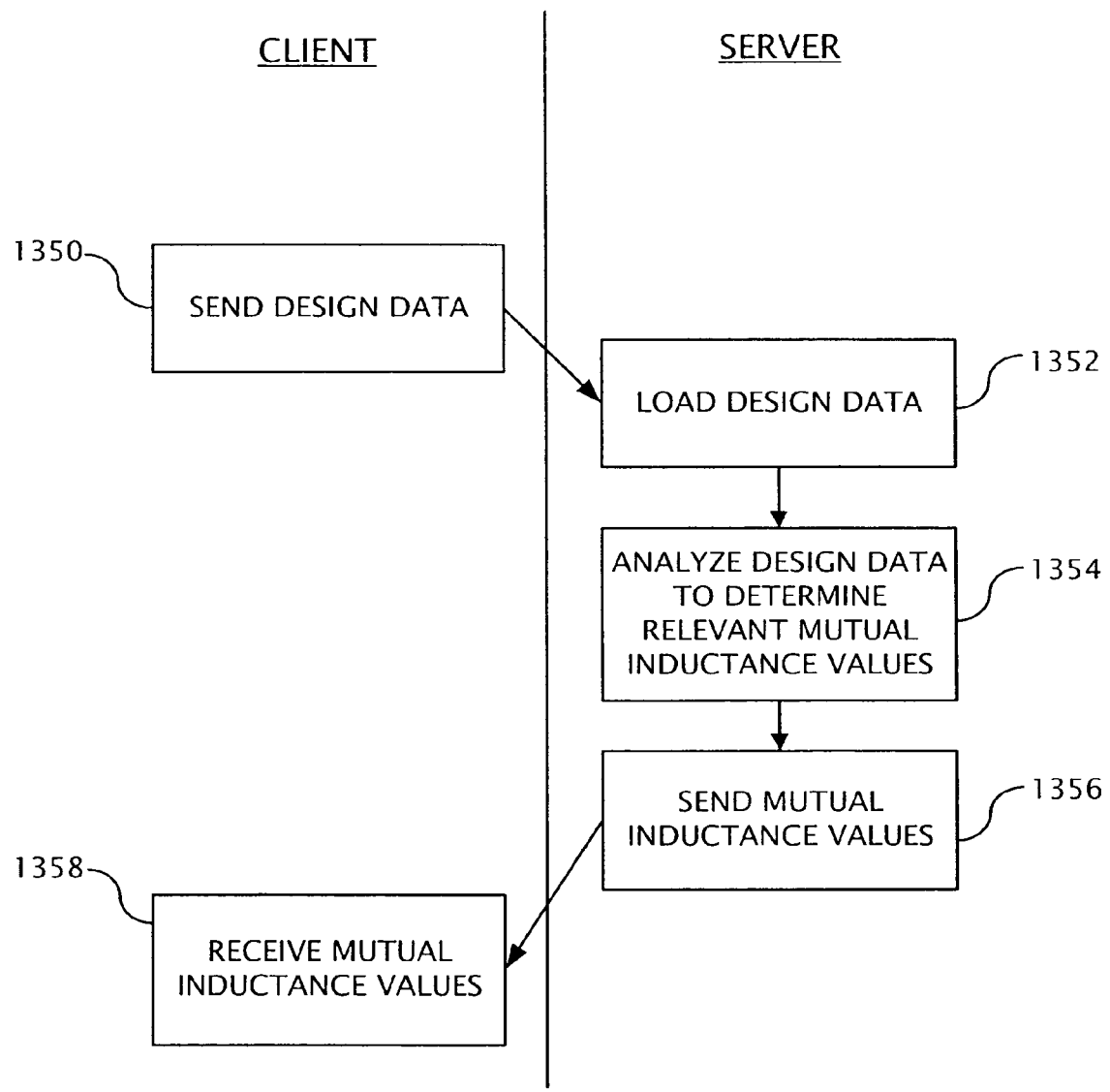
FIG. 13 is a flowchart showing an exemplary manner in which the network of FIG. 12 may be used.

FIG. 13 shows one exemplary manner in which the distributed network shown in FIG. 12 may operate to extract parasitic inductances from an integrated circuit description. In particular, a circuit design data (a circuit design description, such as an HDL, GDSII, or Oasis file) may be analyzed according to any of the embodiments disclosed herein using a remote (possibly overseas) server computer, such as the server computer 1200 shown in FIG. 12. At process block 1350, for example, the client computer sends the circuit design data. At process block 1352, the design data is received and loaded by the server computer. At process block 1354, the design data is analyzed using an inductance extraction technique according to any of the embodiments described above (e.g., methods 600 and 700 illustrated in FIGS. 6 and 7, respectively). A database or data structure of the relevant mutual inductances computed by the inductance extraction procedure can be created. The mutual inductances can be stored, for example, as an updated version of the circuit design data (e.g., included in fields related to each signal wire) or as one or more separate files or data structures. At process block 1356, the server computer sends the mutual inductance values to the client computer, which receives them at process block 1358.

It should be apparent to those skilled in the art that the example shown in FIG. 13 is not the only way to perform diagnostics according to the disclosed technology. For instance, the circuit design data to be analyzed may be stored on a computer-readable medium that is not on a network and that is sent separately to the server (e.g., on a CD-ROM or other computer-readable medium). Moreover, the server computer may perform only a portion of the inductance extraction procedure.

Having illustrated and described the principles of the illustrated embodiments, it will be apparent to those skilled in the art that the embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A computer-implemented method for analyzing mutual inductance, comprising:
with a computer,
receiving a description of a circuit design, the description being indicative of the layout of signal wires, ground wires, and power wires in the circuit design;
grouping at least a portion of the signal wires and the ground wires into at least a first bundle and a second bundle, the first bundle comprising a first signal-wire segment and two or more first corresponding ground wire segments, the second bundle comprising a second signal-wire segment and one or more second corresponding ground-wire segments;
calculating a single representative dipole moment for the first bundle;
calculating a mutual inductance between the first bundle and the second bundle using the representative dipole moment; and
outputting the mutual inductance.

2. The method of claim 1, wherein the grouping is performed such that the ground-wire segments of the first and second bundles have the same length as and are parallel to their respective signal-wire segments.

3. The method of claim 1, wherein the act of calculating the mutual inductance comprises calculating the magnetic flux due to the representative dipole moment of the first bundle through surfaces in the second bundle formed between the second signal-wire segment of the second bundle and the second corresponding ground-wire segments of the second bundle.

4. The method of claim 3, wherein the act of calculating the mutual inductance further comprises calculating a weighted average of the respective contributions of the surfaces.

5. The method of claim 1, wherein the representative dipole moment comprises a weighted average of dipole moments resulting from individual current loops in the first bundle, each individual current loop comprising the first signal-wire segment of the first bundle and a respective one of the first corresponding ground-wire segments of the first bundle.

6. The method of claim 1, wherein the corresponding ground-wire segments in the first bundle and the second bundle are identified as being return paths for their respective signal-wire segments based at least in part on their resistance and separation relative to their respective signal-wire segment.

7. The method of claim 1, further comprising:
evaluating whether a configuration of the first corresponding ground-wire segments of the first bundle is symmetrical with respect to the first signal-wire segment of the first bundle; and
determining whether to perform the acts of calculating the representative dipole moment and calculating the mutual inductance based at least in part on the evaluation.

8. The method of claim 1, further comprising:
evaluating whether a dipole-moment direction of the first bundle is substantially the same as a dipole-moment direction of the second bundle and whether the angle between a perpendicular line to this direction and the line joining the centers of mass of the two bundles is substantially equal to a fixed amount; and
determining whether to perform the acts of calculating the mutual inductance based at least in part on the evaluation.

9. The method of claim 1, further comprising:
evaluating whether the dipole moment of the first bundle is substantially perpendicular to a dipole moment of the second bundle and whether the relative position of the first bundle to the second bundle is such that a center of the second bundle is located substantially on an axis extending through the dipole moment of the first bundle; and
determining whether to perform the act of calculating the mutual inductance based at least in part on the evaluation.

10. One or more computer-readable storage devices storing computer-executable instructions for causing a computer system to perform a method, the method comprising:
receiving a description of a circuit design, the description being indicative of the layout of signal wires, ground wires, and power wires in the circuit design;
grouping at least a portion of the signal wires and the ground wires into at least a first bundle and a second bundle, the first bundle comprising a first signal-wire segment and two or more first corresponding ground wire segments, the second bundle comprising a second signal-wire segment and one or more second corresponding ground-wire segments;
calculating a single representative dipole moment for the first bundle;
calculating a mutual inductance between the first bundle and the second bundle using the representative dipole moment; and
outputting the mutual inductance.

11. The one or more computer-readable storage devices of claim 10, wherein the grouping is performed such that the ground-wire segments of the first and second bundles have the same length as and are parallel to their respective signal-wire segments.

12. The one or more computer-readable storage devices of claim 10, wherein the act of calculating the mutual inductance comprises calculating the magnetic flux due to the representative dipole moment of the first bundle through surfaces in the second bundle formed between the second signal-wire segment of the second bundle and the corresponding second ground-wire segments of the second bundle.

13. The one or more computer-readable storage devices of claim 12, wherein the act of calculating the mutual inductance further comprises calculating a weighted average of the respective contributions of the surfaces.

14. The one or more computer-readable storage devices of claim 10, wherein the representative dipole moment comprises a weighted average of dipole moments resulting from individual current loops in the first bundle, each individual current loop comprising the first signal-wire segment of the first bundle and a respective one of the first corresponding ground-wire segments of the first bundle.

15. The one or more computer-readable storage devices of claim 10, wherein the corresponding ground-wire segments in the first bundle and the second bundle are identified as being return paths for their respective signal-wire segments based at least in part on their resistance and separation relative to their respective signal-wire segment.

16. The one or more computer-readable storage devices of claim 10, wherein the method further comprises:
evaluating whether a configuration of the first corresponding ground-wire segments of the first bundle is symmetrical with respect to the first signal-wire segment of the first bundle; and
determining whether to perform the acts of calculating the representative dipole moment and calculating the mutual inductance based at least in part on the evaluation.

17. The one or more computer-readable storage devices of claim 10, wherein the method further comprises:
evaluating whether a dipole-moment direction of the first bundle is substantially the same as a dipole-moment direction of the second bundle and whether the angle between a perpendicular line to this direction and the line joining the centers of mass of the two bundles is substantially equal to a fixed amount; and
determining whether to perform the acts of calculating the mutual inductance based at least in part on the evaluation.

18. The one or more computer-readable storage devices of claim 10, wherein the method further comprises:
evaluating whether the dipole moment of the first bundle is substantially perpendicular to a dipole moment of the second bundle and whether the relative position of the first bundle to the second bundle is such that a center of the second bundle is located substantially on an axis extending through the dipole moment of the first bundle; and
determining whether to perform the act of calculating the mutual inductance based at least in part on the evaluation.

19. One or more computer-readable storage devices storing design information for an integrated circuit having a layout modified at least in part by a method, the method comprising:
receiving a description of a circuit design, the description being indicative of the layout of signal wires, ground wires, and power wires in the circuit design;
grouping at least a portion of the signal wires and the ground wires into at least a first bundle and a second bundle, the first bundle comprising a first signal-wire segment and two or more first corresponding ground wire segments, the second bundle comprising a second signal-wire segment and one or more second corresponding ground-wire segments;
calculating a single representative dipole moment for the first bundle;
calculating a mutual inductance between the first bundle and the second bundle using the representative dipole moment; and
outputting the mutual inductance.

20. The one or more computer-readable storage devices of claim 19, wherein the grouping is performed such that the ground-wire segments of the first and second bundles have the same length as and are parallel to their respective signal-wire segments.

21. The one or more computer-readable storage devices of claim 19, wherein the act of calculating the mutual inductance comprises calculating the magnetic flux due to the representative dipole moment of the first bundle through surfaces in the second bundle formed between the second signal-wire segment of the second bundle and the second corresponding ground-wire segments of the second bundle.

22. The one or more computer-readable storage devices of claim 21, wherein the act of calculating the mutual inductance further comprises calculating a weighted average of the respective contributions of the surfaces.

23. The one or more computer-readable storage devices of claim 19, wherein the representative dipole moment comprises a weighted average of dipole moments resulting from individual current loops in the first bundle, each individual current loop comprising the first signal-wire segment of the first bundle and a respective one of the first corresponding ground-wire segments of the first bundle.

24. The one or more computer-readable storage devices of claim 19, wherein the corresponding ground-wire segments in the first bundle and the second bundle are identified as being return paths for their respective signal-wire segments based at least in part on their resistance and separation relative to their respective signal-wire segment.

25. The one or more computer-readable storage devices of claim 19, wherein the method further comprises:
evaluating whether a configuration of the first corresponding ground-wire segments of the first bundle is symmetrical with respect to the first signal-wire segment of the first bundle; and
determining whether to perform the acts of calculating the representative dipole moment and calculating the mutual inductance based at least in part on the evaluation.

26. The one or more computer-readable storage devices of claim 19, wherein the method further comprises:
evaluating whether a dipole-moment direction of the first bundle is substantially the same as a dipole-moment direction of the second bundle and whether the angle between a perpendicular line to this direction and the line joining the centers of mass of the two bundles is substantially equal to a fixed amount; and
determining whether to perform the acts of calculating the mutual inductance based at least in part on the evaluation.

27. The one or more computer-readable storage devices of claim 19, wherein the method further comprises:
evaluating whether the dipole moment of the first bundle is substantially perpendicular to a dipole moment of the second bundle and whether the relative position of the first bundle to the second bundle is such that a center of the second bundle is located substantially on an axis extending through the dipole moment of the first bundle; and
determining whether to perform the act of calculating the mutual inductance based at least in part on the evaluation.

* * * * *